(12) United States Patent
Hsieh et al.

(10) Patent No.: US 11,275,314 B2
(45) Date of Patent: Mar. 15, 2022

(54) METHOD AND APPARATUS FOR DIFFRACTION-BASED OVERLAY MEASUREMENT

(71) Applicant: TAIWAN SEMICONDUCTOR MANUFACTURING CO., LTD., Hsinchu (TW)

(72) Inventors: Hung-Chih Hsieh, Miaoli County (TW); Yen-Liang Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/240,805

(22) Filed: Apr. 26, 2021

(65) Prior Publication Data

US 2021/0271175 A1    Sep. 2, 2021

Related U.S. Application Data

(62) Division of application No. 16/803,981, filed on Feb. 27, 2020, now Pat. No. 10,990,023.

(51) Int. Cl.
*G03F 7/20* (2006.01)

(52) U.S. Cl.
CPC ................. *G03F 7/70633* (2013.01)

(58) Field of Classification Search
CPC ................................... G03F 7/70633
See application file for complete search history.

(56) References Cited

U.S. PATENT DOCUMENTS

| | | |
|---|---|---|
| 9,347,879 B2 | 5/2016 | Adel et al. |
| 9,547,244 B2 | 1/2017 | Li |
| 2004/0066517 A1 | 4/2004 | Huang et al. |
| 2004/0101983 A1 | 5/2004 | Jones et al. |
| 2016/0025484 A1 | 1/2016 | Kim et al. |
| 2017/0115579 A1 | 4/2017 | Lin et al. |
| 2017/0293233 A1 | 10/2017 | Van Der Schaar et al. |
| 2017/0350829 A1 | 12/2017 | Den Boef |
| 2019/0101835 A1 | 4/2019 | Chen |

FOREIGN PATENT DOCUMENTS

WO    2009/078708 A1    6/2009

OTHER PUBLICATIONS

Notice of Allowance issued in U.S. Appl. No. 16/803,981 dated Dec. 16, 2020.

*Primary Examiner* — Steven Whitesell Gordon
(74) *Attorney, Agent, or Firm* — McDermott Will & Emery LLP

(57) ABSTRACT

A method of overlay error measurement includes disposing a reference pattern module over a substrate. The substrate includes first and second overlay measurement patterns in first and second locations. The reference pattern module includes first and second reference patterns. The method includes creating a first overlap of the first reference pattern with the first overlay measurement pattern and a second overlap of the second reference pattern with the second overlay measurement pattern. The method further includes determining a first overlay error between the first reference pattern of the reference pattern module and the first overlay measurement pattern of the substrate and determining a second overlay error between the second reference pattern and the second overlay measurement pattern. The method also includes determining a total overlay error between the first and second overlay measurement patterns of the substrate based on the first and second overlay errors.

20 Claims, 15 Drawing Sheets

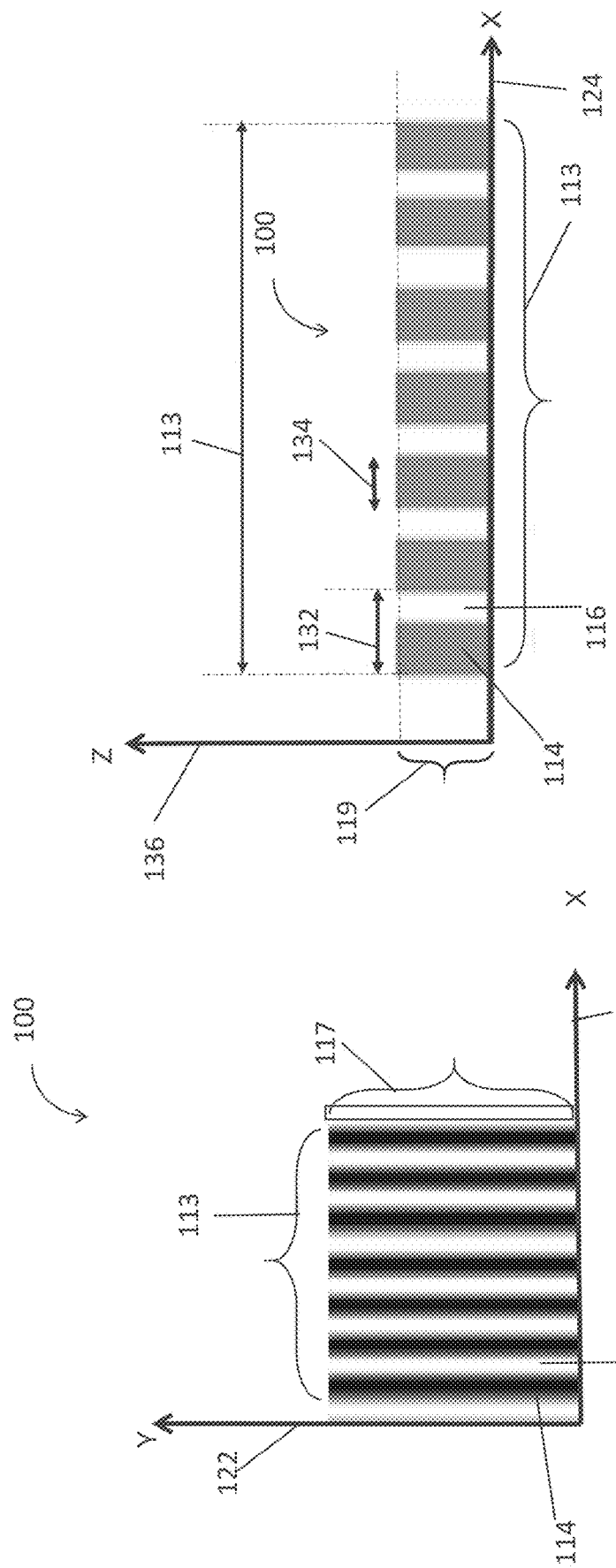

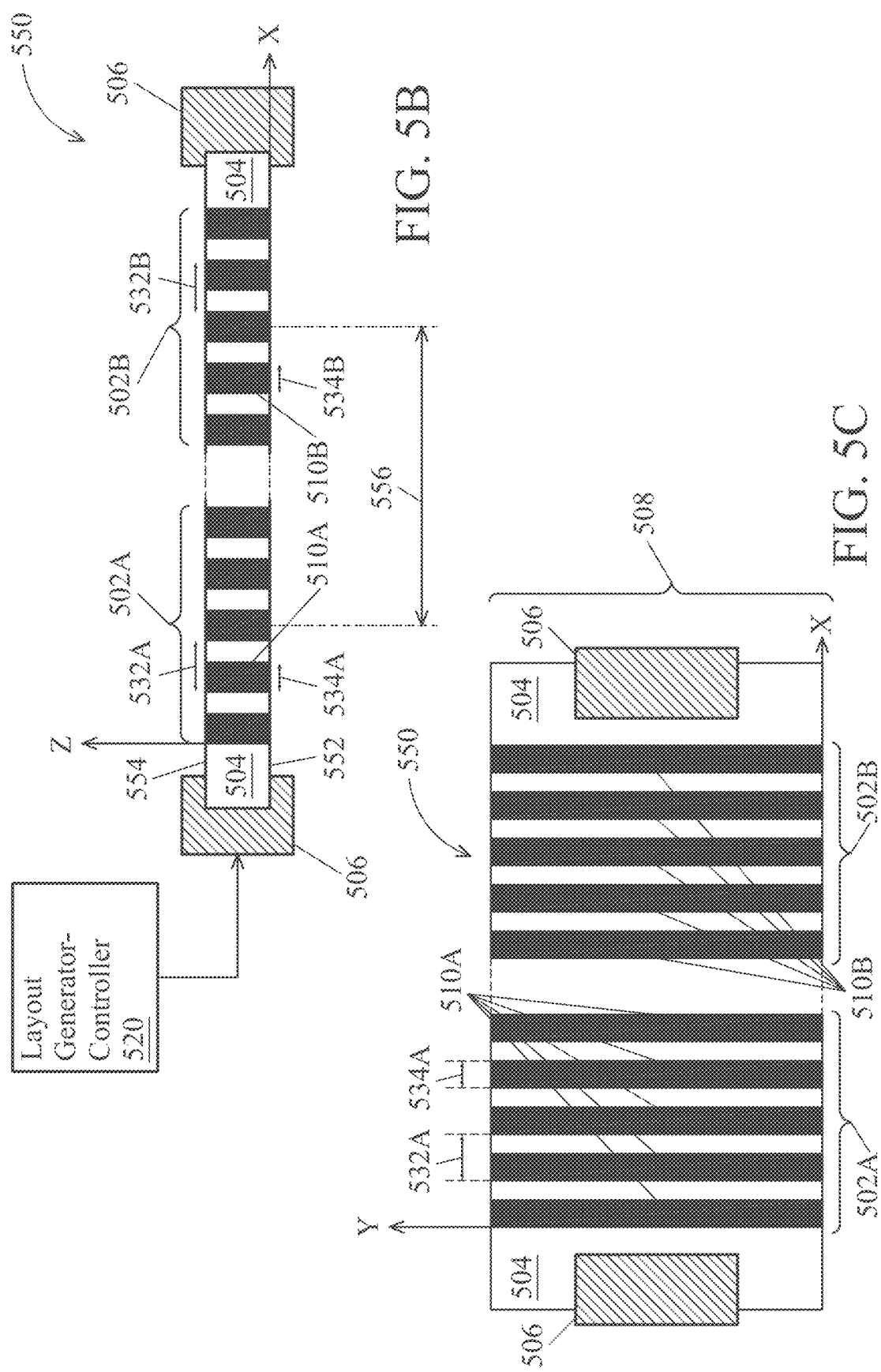

METHOD AND APPARATUS FOR DIFFRACTION-BASED OVERLAY MEASUREMENT

This application is a Divisional of U.S. patent application Ser. No. 16/803,981, filed on Feb. 27, 2020, now U.S. Pat. No. 10,990,023, the entire disclosure of which is incorporated herein by reference.

BACKGROUND

As the semiconductor industry has progressed into nanometer technology process nodes in pursuit of higher device density, reducing overlay errors of a photo resist layout pattern and an underlying layout pattern in a lithography operation has become one of the important issues. Therefore, an efficient method of precisely determining an overlay error between the photo resist layout pattern and one of the underlying layout patterns is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B respectively illustrate a top view and a cross-sectional view of an overlay measurement pattern to be generated by a light beam lithography system on a wafer in accordance with some embodiments of the present disclosure.

FIGS. 5A, 5B, 5C, and 5D respectively illustrate a substrate having two overlay measurement patterns, a cross-sectional view of a reference pattern module, a top view of the reference pattern module, and a and a cross-sectional view of the reference pattern module that placed over the substrate in accordance with some embodiments of the present disclosure.

DETAILED DESCRIPTION

Figures 2A, 2B:
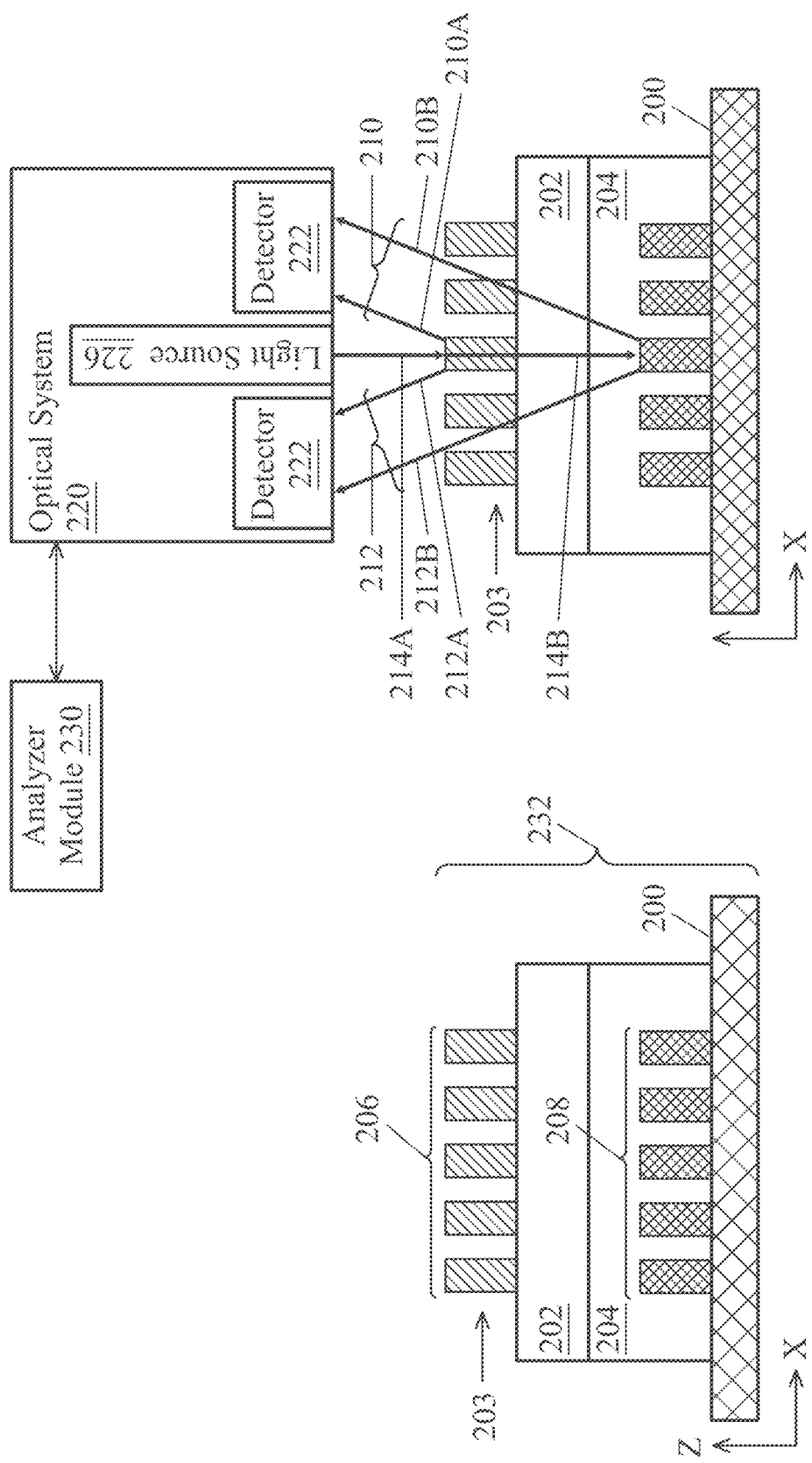
FIGS. 2A and 2B respectively illustrate cross-sectional views of a substrate having two overlay measurement patterns and FIG. 2B includes an optical system for determining an overlay error between the two overlay measurement patterns of the substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

During an integrated circuit (IC) design, a number of layout patterns of the IC, for different steps of IC processing, are generated. The layout patterns include geometric shapes corresponding to structures to be fabricated on a wafer. The layout patterns may be mask layout patterns that are projected, e.g., imaged, on the wafer to create the IC. A lithography process transfers a layout pattern of a mask to the wafer such that etching, implantation, or other steps are applied only to predefined regions of the wafer. Multiple layout patterns may be transferred to different layers of the wafer to create the different structures on the wafer. Thus, a second or subsequent layout pattern may be transferred to a second layer on the wafer when a first or previous layout pattern exists in a different first layer of the wafer beneath the second layer.

As described, multiple layout patterns may be transferred to different layers of the wafer to create the different structures on the wafer. It is ideal that there is no overlay error between the layout patterns that are produced on a wafer. In some embodiments, an overlay measurement pattern, e.g., a grating, is included in each layout pattern. The overlay measurement pattern, which may not be part of the IC circuit, is used for determining the overlay error between different layout patterns that are disposed on the wafer. In some embodiments, the overlay error between two layout patterns of a wafer is measured when the overlay measurement patterns of the two layout patterns overlap. The overlapped overlay measurement patterns of the two layout patterns are irradiated with a beam of light, e.g., a coherent beam of light, and the overlay error between two layout patterns is determined, e.g., calculated, based on diffracted light that is reflected back from the overlapped overlay measurement patterns of the two layout patterns.

In some embodiments, a first layout pattern that includes a first overlay measurement pattern is imaged, e.g., projected, onto a wafer to create the first layout pattern and the first overlay measurement pattern in a first layer on the wafer. In some embodiments, the first layer is covered with a second layer and a second layout pattern that includes a second overlay measurement pattern is created in the second layer. The second layer is initially covered with a resist material layer and the second layout pattern that includes the second overlay measurement pattern is imaged onto the resist material layer on top of the second layer. Therefore, the second overlay measurement pattern is in the resist material layer and the resist material layer is on top of the second layer that is on top of the first layer, which includes the first overlay measurement pattern. In some other embodiments, the second layer does not exist and the first layer is covered with the resist material layer and the second layout pattern that includes the second overlay measurement pattern is imaged onto the resist material layer that is directly on top of the first layer. Therefore, the second overlay measurement pattern is in the resist material layer and the resist material layer is on top of the first layer, which includes the first overlay measurement pattern. In either case, after the resist material is developed, if the first overlay measurement pattern of the first layer and the second overlay measurement pattern of the resist material layer on top of the first layer overlap, the overlay error between the first layout pattern and the second layout pattern may be measured. In some embodiments, when the overlay error is below a threshold, the developed resist material that includes the second layout pattern is used in the next processing step. Otherwise, the resist material is removed and a new resist layout pattern is formed with corrected alignment in lithography process.

As noted, the overlay error may be measured when the first overlay measurement pattern of the first layer and the second overlay measurement pattern of the resist material layer overlap. In some embodiments, each one of the layout patterns includes a plurality of overlay measurement patterns to make sure overlap happens in at least one location that produces a strong diffracted light that is reflected back from the overlapped overlay measurement patterns. In some embodiments, a reference pattern module including one or more reference patterns is disposed on the wafer. Instead of overlapping the overlay measurement pattern of the resist material layer with the overlay measurement pattern of a layer beneath the resist material layer to determine the overlay error, the overlay error of each layer of the substrate, including the resist material layer, is determined with respect to the reference pattern module. Therefore, creating an overlap between the overlay measurement patterns of the resist material layer and a layer beneath the resist material layer is avoided and also creating a plurality of overlay measurement patterns in the layout pattern of a layer is avoided.

In some embodiments, the reference pattern module includes a liquid crystal display (LCD) panel having a top transparent plate, a bottom transparent plate and liquid crystal enclosed therebetween. Top and bottom electrodes are disposed on inner surfaces of the top and bottom transparent plates to generate patterns on the LCD panel. In addition, polarizers are disposed on the top and bottom transparent plates to polarize the light with 90 degrees polarization phase shift with respect to each other.

In some embodiments, by applying a voltage between specific portions of the top and bottom electrodes, one or more desired reference patterns are generated in the LCD panel. In some embodiments, one or more of the generated desired reference patterns is the same as the overlay measurement pattern of the layers of the substrate. In some embodiments, by adjusting the voltage applied between the top and bottom electrode surfaces of the liquid crystal panel, the light transmission between the top surface and the bottom surface can be adjusted between 0.1% and 0.99%. In some embodiments, a portion of the light that enters from the top surface is diffracted by the reference pattern that is generated in the liquid crystal panel of the reference pattern module. In some embodiments, a portion of the light that enters from the top surface is diffracted and reflected by the reference pattern that is generated in the liquid crystal panel of the reference pattern module.

In some embodiments, the reference pattern module is disposed over a substrate and the substrate has a first overlay measurement pattern in a first layer of the substrate and a second overlay measurement pattern in a resist material layer of on top of the first layer. The liquid crystal panel of the reference pattern module may generate a reference pattern overlapping the first overlay measurement pattern of the first layer. Also, the liquid crystal panel of the reference pattern module may generate another reference pattern overlapping the second overlay measurement pattern of the resist material layer. In some embodiments, the overlay error is measured by: First, disposing the reference pattern module over the first layer and resist material layer. Second, generating a primary reference pattern in the reference pattern module that overlaps the first overlay measurement pattern of the first layer. Third, generating a secondary reference pattern in the reference pattern module that overlaps the second overlay measurement pattern of the resist material layer. Fourth, measuring a first overlay error between the primary reference pattern and the first overlay measurement pattern and measuring a second overlay error between the secondary reference pattern and the second overlay measurement pattern. Fifth, determining the overlay error between the layout pattern of the first layer and the layout pattern of the resist material layer based on the first and second overlay errors. In some embodiments, the overlay error between the layout pattern of the first layer and the layout pattern of the resist material layer is also determined based on the information of the reference pattern module, e.g., based on a distance between the primary and secondary reference patterns and additionally based on an expected distance between the first and the second overlay measurement patterns.

FIGS. 1A and 1B respectively illustrate a top view and a cross-sectional view of an overlay measurement pattern to be generated by a light beam lithography system on a wafer in accordance with some embodiments of the present disclosure. FIG. 1A shows an overlay measurement pattern 100 that is extended in a Y-direction 122 with a length 117 and is distributed in an X-direction 124 in an extent 113. The overlay measurement pattern 100 includes dark strips 114 and bright strips 116. In some embodiments, dark strips 114 are low reflectance portions and the bright strips 116 are high reflectance portions when an incident light beam radiates the overlay measurement pattern 100.

FIG. 1B shows a cross-sectional view of the overlay measurement pattern 100 that is extended in a Z-direction 136 with a height 119 and is distributed in the X-direction 124. In some embodiments, the dark strips 114 are the features of a layer (e.g., a photo resist pattern) that are remained after a lithography process is applied and the bright strips 116 are the locations that are removed after the lithography process is applied. In other embodiments, the dark patterns and the bright patterns are reversed depending on, for example, a material of the underlying layer. As shown in the cross-sectional view, the dark strips 114 have a width 134, e.g., critical dimension (CD), and the overlay measurement pattern 100 has a pitch 132. In some embodiments, when a wavelength of the incident light beam is comparable with the width 134 and/or the pitch 132 of the overlay measurement pattern, the incident light beam is diffracted and a portion of the incident light beam is reflected back. The diffraction of the incident light beam is described with respect to FIG. 2B.

FIGS. 2A and 2B respectively illustrate cross-sectional views of a substrate 232 having two overlay measurement patterns 206 and 208. FIG. 2B further illustrates an optical system 220 for determining an overlay error between the two overlay measurement patterns of the substrate in accordance with some embodiments of the present disclosure. FIG. 2A includes a cross-sectional view of an overlay measurement pattern 208 in a first layer 204 that is disposed on top of an underlying substrate 200. In some embodiments, the overlay measurement pattern 208 along with a corresponding circuit layout pattern (not shown) is initially disposed on the underlying substrate 200 and then the first layer 204 is disposed, e.g., epitaxially grown or deposited, over the overlay measurement pattern 208. In some embodiments, a second layer 202 is disposed, e.g., epitaxially grown or deposited, over the first layer 204. In some embodiments, a resist material layer 203 is deposited over the second layer 202 and the resist material layer 203 is exposed and developed to produce an overlay measurement pattern 206 along with a corresponding layout pattern (not shown) in the resist material layer 203. In some embodiments, the overlay measurement patterns 206 and 208 are consistent with the overlay measurement pattern 100 of FIGS. 1A and 1B. Also, consistent with FIGS. 1A and 1B, the overlay measurement patterns 206 and 208 are distributed in the X-direction to measure an overlay error in the X-direction. In some embodiments, overlay measurement patterns distributed in the Y-direction are also disposed to measure an overlay error in the Y-direction. In some embodiments, the second layer 202 does not exist and the overlay measurement pattern 206 is disposed on top of the first layer 204. In some embodiments, a substrate 232 includes the underlying substrate 200 and a structure including the first layer 204, the second layer 202, and the resist material layer 203, on top of the underlying substrate 200.

FIG. 2B shows an optical system 220 that includes one or more light sources 226 and one or more detectors 222. FIG. 2B further shows the overlay measurement patterns 206 and 208 and the first layer 204, the second layer 202, and the resist material layer 203. In some embodiments the light source 226 of the optical system 220 transmits, e.g., radiates, an incident light beam 214A to the overlay measurement patterns 206 and 208 that have an overlap in the X-direction and in the Y-direction. In some embodiments, the overlay measurement patterns 206 and 208 have a same pitch and the light source 226, which is a coherent light source, has a wavelength comparable to the pitch of the overlay measurement patterns 206 and 208. A portion of the incident light beam 214A is diffracted and reflected from the overlay measurement pattern 206 and produces the negative and positive first order diffractions 210A and 212A respectively. A remaining portion 214B of the incident light beam 214A passes through the overlay measurement pattern 206 and is diffracted and reflected from the overlay measurement pattern 208 and produces the negative and positive first order diffractions 210B and 212B respectively. Thus, the first order diffractions 210 that includes the negative first order diffractions 210A and 210B that are reflected are detected by one detector 222 and the first order diffractions 212 that includes the positive first order diffractions 212A and 212B that are reflected are detected by another detector 222.

An analyzer module 230 shown in FIG. 2B is coupled to the optical system 220. The analyzer module 230 receives corresponding signals of the detected first order diffractions 210 and 212 and performs an analysis on the corresponding signals to determine a drift, e.g., a shift, between the overlay measurement patterns 208 and 206.

In some embodiments, the first layer 204 includes the overlay measurement pattern 208 as a portion of a first layout pattern. Also, the resist material layer 203 that is deposited on the second layer 202 includes the overlay measurement pattern 206 as a portion of the second layout pattern. Thus, the lateral positional difference between the overlay measurement patterns 208 and 206 indicates the lateral positional difference between the first layout pattern of the first layer 204 and the second layout pattern to be created in the second layer 202 using the resist material layer 203. In some embodiments, the top overlay measurement pattern 206 and the bottom overlay measurement pattern 208 have the same pitch and the same shape such that the number of boxes (e.g., sub-patterns of the overlay measurement pattern), the width of the boxes, and the distance between the boxes in the overlay measurement patterns 206 and 208 are the same. In some embodiments, the top overlay measurement pattern 206 and the bottom overlay measurement pattern 208 coincide such that the boxes in the overlay measurement patterns 206 and 208 coincide and there is no drift between the boxes of the top overlay measurement pattern 206 and the boxes of the bottom overlay measurement pattern 208. In some embodiments, due to the numerical aperture of the optical system 220, e.g., due to the numerical aperture of the detectors 222, the first order diffractions 210 and 212 enter the detectors and the higher order diffractions do not enter the optical system 220.

Figures 3A, 3B, 3C:
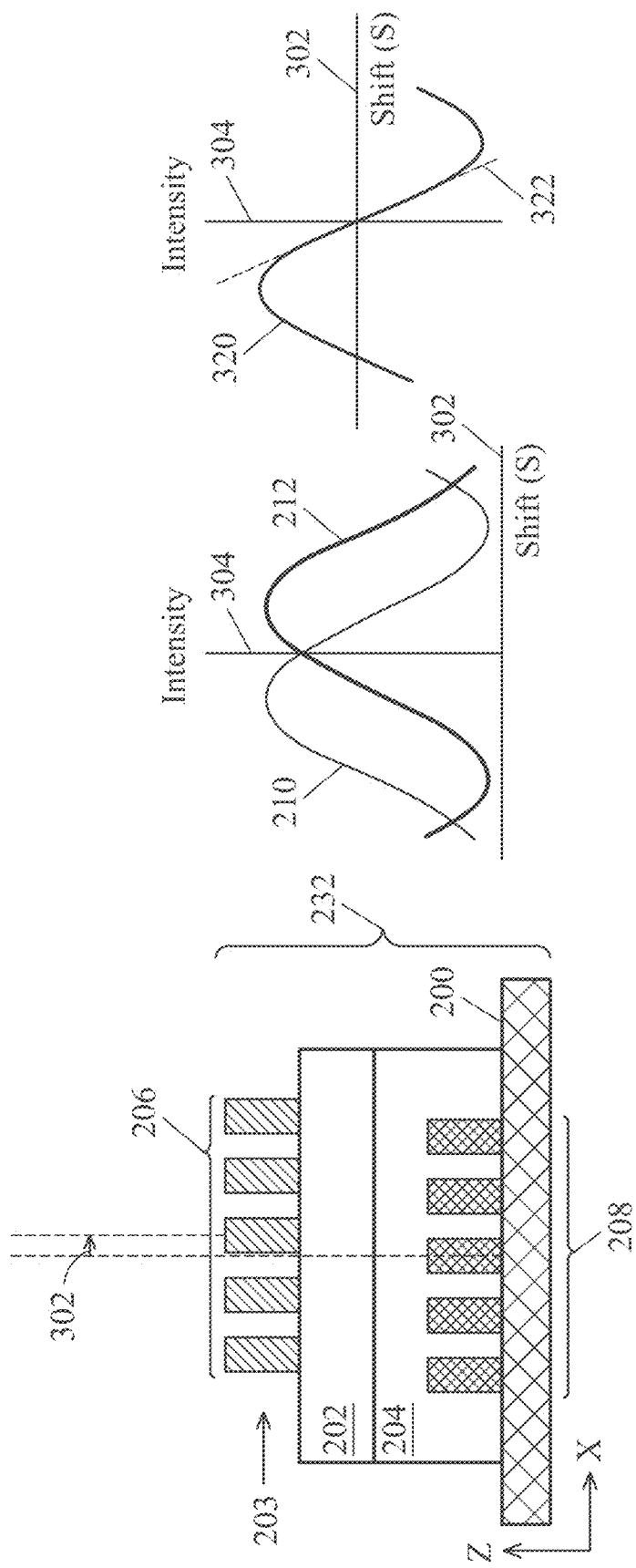
FIGS. 3A, 3B and 3C respectively illustrate a substrate having two overlay measurement patterns with one overlay measurement pattern having an overlay shift (drift), positive and negative first order diffracted light intensities as a function of the overlay shift, and a difference of the first order diffracted light intensities as a function of the overlay shift in accordance with some embodiments of the present disclosure.

FIGS. 3A, 3B and 3C respectively illustrate a substrate 232 having two overlay measurement patterns 206 and 208 with one overlay measurement pattern having an overlay shift (FIG. 3A), negative and positive first order diffractions 210 and 212 as a function of the overlay shift (FIG. 3B), and a difference of the first order diffracted light intensities as a function of the overlay shift distance 302 (FIG. 3C) in accordance with some embodiments of the present disclosure. FIG. 3A is consistent with FIG. 2A with a difference that the overlay measurement pattern 206 of the resist material layer 203 on top of the second layer 202 is shifted with respect to the overlay measurement pattern 208 by a shift distance 302 in the positive X-direction. The shift distance 302 is a distance between the center (e.g., the center of mass or the center of the center pattern) of the two overlay measurement patterns 206 and 208.

FIG. 3B shows light intensities of the negative and positive first order diffractions 210 and 212 as a function of overlay shift distance 302. In some embodiments, FIG. 3B respectively shows the signals corresponding to the negative and positive detected first order diffractions 210 and 212 that are detected by detectors 222 of the optical system 220 in FIG. 2B. In some embodiments, the analyzer module 230 receives corresponding signals of detected first order diffractions 210 and 212 and subtracts the signal corresponding to the negative first order diffractions 210 from the signal corresponding to the positive first order diffractions 212 to generate an asymmetry (AS) function 320 (FIG. 3C). As shown in FIG. 3B, the signal corresponding to the negative first order diffraction 210 has an intensity peak in the negative region of the shift distance 302 and the signal corresponding to the positive first order diffraction 212 has an intensity peak in the positive region of the shift distance 302. Also, FIG. 3B shows that the signals corresponding to the negative and positive detected first order diffractions 210 and 212 are symmetric with respect to the intensity coordinate 304. Although the shift distance 302 is displayed as the shift between the edges of the boxes of the overlay measurement patterns 206 and 208, the origin of the overlay measurement patterns 206 and 208 may be defined as the center of the overlay measurement patterns 206 and 208 and the shift distance 302 can be defined with respect to a shift in the center of the overlay measurement patterns 206 and 208.

FIG. 3C shows the AS function 320 as a function of the shift distance 302. Because the signals corresponding to the negative and positive detected first order diffractions 210 and 212 are symmetric with respect to the intensity coordinate 304, the AS function 320 passes through the origin. In some embodiments the AS function may be written as:

$$AS = k \cdot \sin\left[\left(\frac{2\Pi}{P}\right) \cdot (S)\right]$$

where P is a pattern (grating) pitch, S is the shift distance 302, and k is determined based on the light wavelength and a layer structure (e.g., thickness, refractive index, and absorption coefficient) of the first layer, the second layer, and the resist material layer. In some embodiments, when the shift distance 302 is small compared to the pattern pitch P, the AS function may be written as:

$$AS = k \cdot \left(\frac{2\Pi}{P}\right) \cdot (S)$$

where $$K = k \cdot \left(\frac{2\Pi}{P}\right)$$

is the slope 322 of the AS function 320 at the origin in FIG. 3C.

Figure 4:
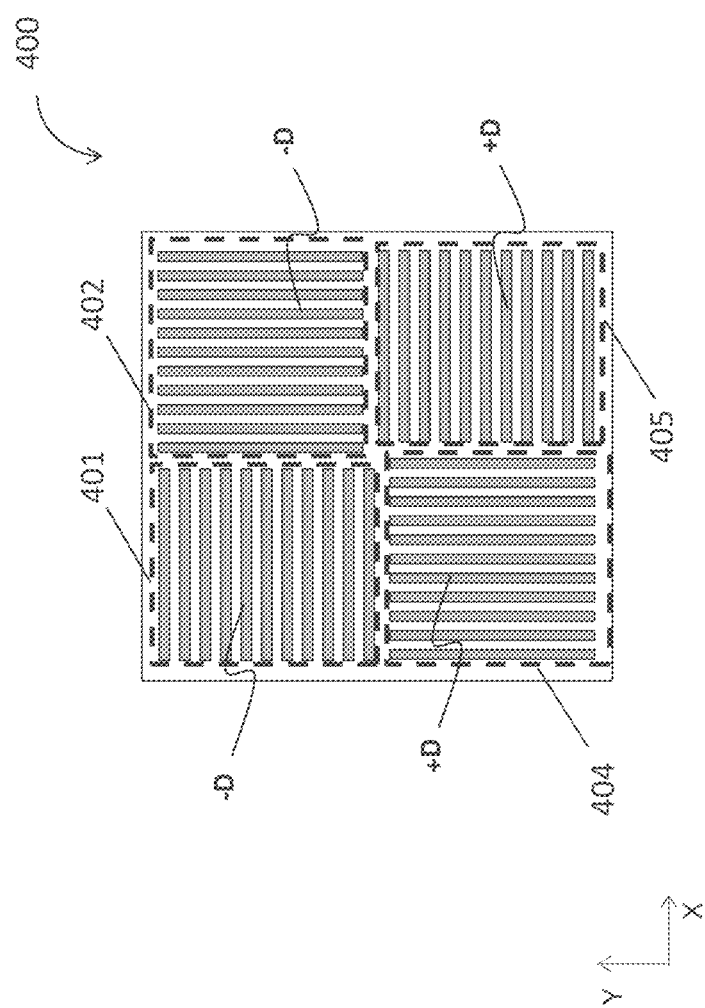
FIG. 4 illustrates an exemplary overlay measurement pattern in accordance with an embodiment of the present disclosure.

FIG. 4 illustrates an exemplary overlay measurement pattern in accordance with an embodiment of the present disclosure. The overlay measurement pattern 400 of FIG. 4 that may be used as the overlay measurement pattern 206 and may be produced in the resist material layer 203 has four different overlay measurement patterns. In some embodiments, when the overlay measurement pattern 400 on the top coincides with the bottom overlay measurement pattern 208, the upper right portion 402 and the lower left portion 404 of the overlay measurement pattern 400 respectively have an initial shift of −D and +D in the positive X-direction with respect to the bottom overlay measurement pattern 208. In some embodiments, the overlay measurement pattern 400 on the top is placed with an X-direction overlay error OV, e.g., overlay placement error in the X-direction, over the bottom overlay measurement pattern 208 and thus the AS function between the upper right portion 402 and the bottom overlay measurement pattern 208 becomes:

$$AS1 = k \cdot \sin\left[\left(\frac{2\Pi}{P}\right) \cdot (OV - D)\right]$$

which is a point on the AS function 320 of FIG. 3C with a shift S=(OV−D). The AS function between the upper right portion 402 and the bottom overlay measurement pattern 208 may be approximated as AS1=K. (OV−D), which is a point on the slope 322 of the AS function 320 of FIG. 3C with the shift S=(OV−D). Also, the AS function between the lower left portion 404 and the bottom overlay measurement pattern 208 becomes:

$$AS2 = k \cdot \sin\left[\left(\frac{2\Pi}{P}\right) \cdot (OV + D)\right]$$

which is a point on the AS function 320 of FIG. 3C with a shift S=(OV+D). The AS function between the lower left portion 404 and the bottom overlay measurement pattern 208 may be approximated as AS2=K. (OV+D), which is a point on the slope 322 of the AS function 320 of FIG. 3C with the shift S=(OV+D). Thus, by using the optical system 220 of FIG. 2B and measuring the negative and positive detected first order diffractions 210 and 212, the AS function value AS1 between the upper right portion 402 of the overlay measurement pattern 400 and the bottom overlay measurement pattern 208 and the AS function value AS2 between the lower left portion 404 of the overlay measurement pattern 400 and the bottom overlay measurement pattern 208 can be determined and the overlay error OV in the X-direction may be determined as:

$$OV = D \cdot \left(\frac{AS1 + AS2}{AS2 - AS1}\right)$$

In some embodiments, when the overlay measurement pattern 400 on the top coincides with the bottom overlay measurement pattern 208, the upper left portion 401 and the lower right portion 405 of the overlay measurement pattern 400 respectively have an initial shift of −D and +D in the positive Y-direction with respect to the bottom overlay measurement pattern 208. Thus, the overlay error in the Y-direction may similarly be determined.

In some embodiments and as shown in FIGS. 1A and 1B, a width 113 of each portion of the overlay measurement pattern 400 is between 300 nm and 40,000 nm. A CD of the sub-patterns, e.g., boxes, of each portion of the overlay measurement pattern 400 is between 10 nm and 1400 nm. A pitch between the sub-patterns of each portion of the overlay measurement pattern 400 is between 100 nm and 1500 nm.

Figure 5A:
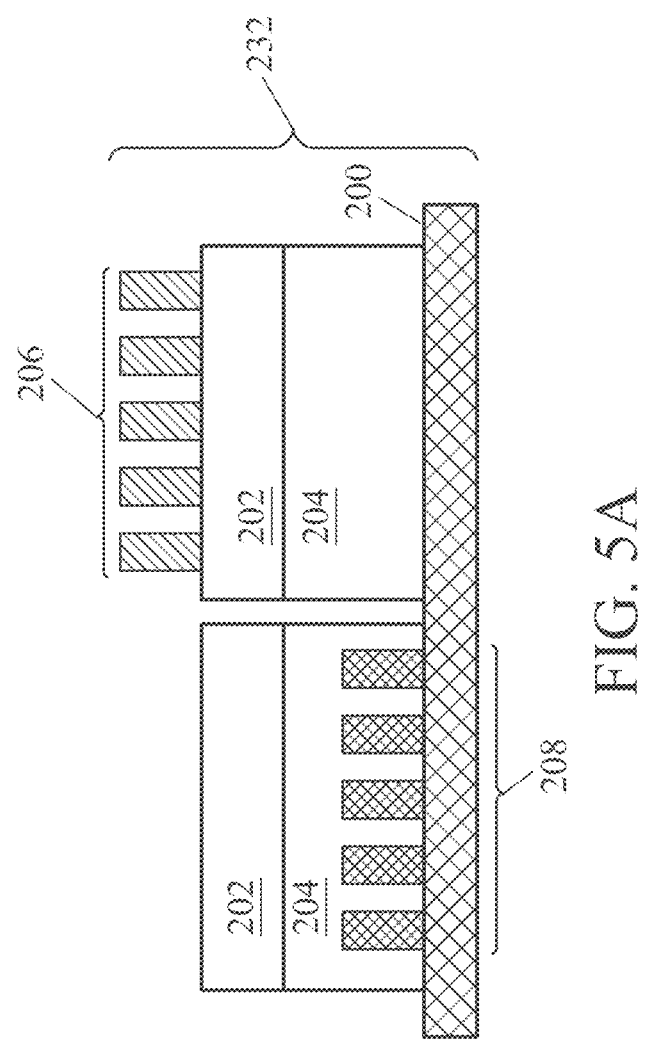

FIGS. 5A, 5B, 5C, and 5D respectively illustrate a substrate 232 having two overlay measurement patterns 206 and 208, a cross-sectional view of a reference pattern module, a top view of the reference pattern module, and a cross-sectional view of the reference pattern module placed over the substrate in accordance with some embodiments of the present disclosure. FIG. 5A is consistent with FIG. 3A with the difference that the top and bottom overlay measurement patterns 206 and 208 are in different non-overlapping portions of the substrate. As shown, the top and bottom overlay measurement patterns 206 and 208 are in different locations over the underlying layer or substrate 200 that may not be adjacent to each other. As described, the overlay measurement pattern 208 is part of the first layout pattern of the first layer 204 and the overlay measurement pattern 206 is created in the resist material layer 203 on top of the second layer 202 disposed over the first layer 204. Also as described, the second layer 202 does not exist in some embodiments and the resist material layer 203 is disposed on top of the first layer 204.

FIG. 5B is a cross-sectional view of a reference pattern module 550, which is an LCD panel 504 having a top surface 554 and a bottom surface 552. In some embodiments, the LCD panel is an LCD flat panel 504 having a plurality of pixels and each pixel is controlled by at least one thin film transistor (TFT). In some embodiments, a layout generator-controller 520 includes a display card for generating signal that are applied to the TFTs to turn on/off the pixels of the LCD panel to create the sub-patterns 510A and 510B, e.g., rectangular boxes, in the LCD panel. In some embodiments, each one of the sub-patterns 510A and 510B includes a plurality of pixels where each pixel is located between the top and bottom surfaces 554 and 552. The TFT transistors may change the transmission of the pixels to generate the sub-patterns 510A and 510B. In some embodiments, the dark sub-patterns 510A and 510B are low reflectance portions and the bright boxes neighboring the sub-patterns 510A and 510B are high reflectance portions when an incident light beam radiates the reference patterns 502A and 502B. Thus, a transmission of the sub-patterns 510A and 510B may change if a voltage, e.g., signal, is applied to the TFTs that control the sub-patterns 510A and 510B. Thus, by applying the voltage between the TFT transistors of the sub-patterns 510A and 510B to generate a desired pattern, the group of sub-patterns 510A may perform as a reference pattern 502A and the group of sub-patterns 510B may perform as a reference pattern 502B. As shown in FIGS. 5B and 5C the reference patterns 502A and 502B may not be adjacent to each other. In some embodiments, the sub-patterns 510A (e.g., boxes) of the reference pattern 502A have a width 534A and a pitch 532A and the sub-patterns 510B (e.g., boxes) of the reference pattern 502B have a width 534B and a pitch 532B. In some embodiments, the reference pattern module 550 is held in with supporting fixtures 506.

The layout generator-controller 520 is coupled to the reference pattern module 550. In some embodiments, the layout generator-controller 520 generates the signals to be applied to the TFT transistors that control the sub-patterns 510A and 510B to generate the reference patterns 502A and 502B of the reference pattern module 550. In some embodiments, the layout generator-controller 520 controls a location of the reference pattern module 550 in the X-direction and/or Y-direction. In some embodiments, by turning on/off the TFT transistors, the layout generator-controller 520 moves the reference patterns 502A and 502B by the pixel resolution of the LCD panel.

In some embodiments, a distance 556 between the center (e.g., the center of mass or the center of the center pattern) of reference patterns 502A and the center of reference patterns 502B is fixed, known or predetermined. In some embodiments, the distance 556 is a known expected distance between the center of the overlay measurement patterns 206 and 208 of the substrate 232. In some embodiments, the TFT transistors are turned on and off to change the transmission of the pixels of the LCD panel from transparent, e.g., clear, to opaque, e.g., dark.

In some embodiments and depending on characteristics of the liquid crystal material between the top and bottom surfaces 554 and 552, by applying a positive voltage of 5 volts to the top surface contact and applying a ground voltage to the bottom surface contact of the sub-patterns 510A and 510B, the reference pattern module 550 exhibits reference patterns 502A and 502B. Thus, the reference pattern module 550 may not allow the light beam that perpendicularly enters from the top surface of the sub-patterns 510A and 510B to exit the bottom surface of the sub-patterns 510A and 510B. In some embodiments, the positive voltage applied to the top surface contact is reduced such that a portion of the light beam that perpendicularly enters from the top surface of the sub-patterns 510A and 510B exists the bottom surface of the sub-patterns 510A and 510B. In some embodiments, a portion of the light that enters from the top surface is diffracted and reflected by the one or more overlay measurement patterns that are generated by the sub-patterns 510A and 510B in the reference pattern module 550.

FIG. 5C is a top view of the reference pattern module 550 and shows the reference patterns 502A and 502B generated by the layout generator-controller 520 in the reference pattern module 550. In some embodiments, the sub-patterns 510A have a uniform width 534A and/or the sub-patterns 510B have a uniform width 534B and the width 534A is different from the width 534B. In some embodiments, the reference pattern 502A has a uniform pitch 532A between each two neighboring sub-patterns 510A and/or the reference pattern 502B has a uniform pitch 532B between each two neighboring sub-patterns 510B and the pitch 532A is different from the pitch 532B. In some embodiments, at least one of the widths 534A of the sub-patterns 510A of the reference pattern 502A and/or at least one of the widths 534B of the sub-patterns 510B of the reference pattern 502B are not the same. In some embodiments, at least one the pitches 532A between each two neighboring sub-patterns 510A of the reference pattern 502A and/or one of the pitches 532B between each two neighboring sub-patterns 510B of the reference pattern 502B are not the same.

In some embodiments, the layout generator-controller 520 generates one or more reference patterns in the reference pattern module 550 that are consistent with the overlay measurement pattern 400 of FIG. 4. In some embodiments, the layout generator-controller 520 generates multiple reference patterns consistent with the overlay measurement pattern 400 at different locations of the reference pattern module 550, such that at least two of the reference patterns are not adjacent to each other. In some embodiments, the reference pattern module 550 has a length 508 in the Y-direction.

Figure 5D:
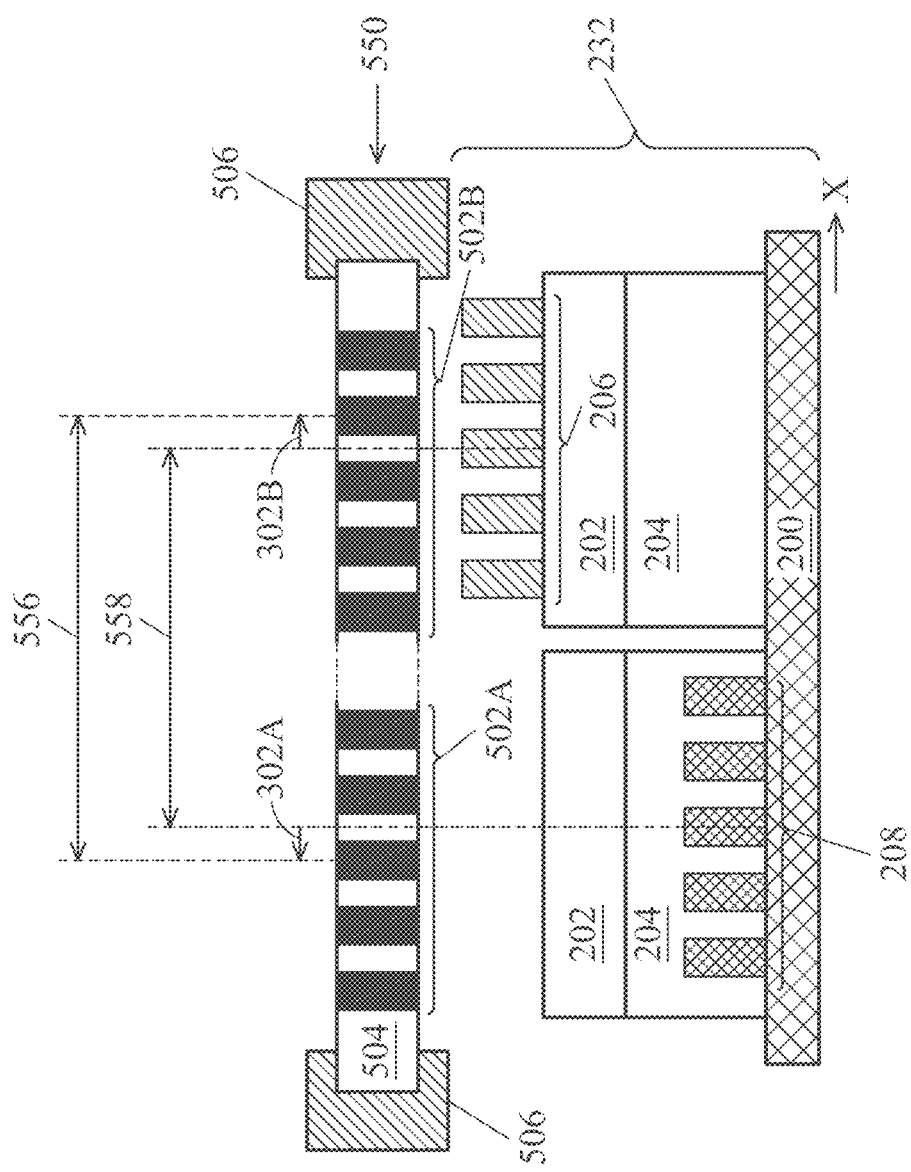

FIG. 5D is a cross-sectional view of the reference pattern module 550 placed over the substrate 232. As shown, the reference pattern 502A is shifted by a shift distance 302A, e.g., an overlay error, in the negative X-direction with respect to the overlay measurement pattern 208 of the substrate 232 and thus the shift distance 302A is a negative distance. In addition, the reference pattern 502B is shifted by a shift distance 302B, e.g., an overlay error, in the positive X-direction with respect to the overlay measurement pattern 206 of the substrate 232 and thus the shift distance 302B is a positive distance. Thus, the total overlay shift distance (total overlay error) between the overlay measurement patterns 206 and 208 is the difference between the distances 302A and 302B and because the distances 302A and 302B have different polarity the values add to each other.

In some embodiments, both of the distances 302A and 302B have the same polarity (not shown). The total overlay shift distance (total overlay error) between the overlay measurement patterns 206 and 208 is the difference between the distances 302A and distance 302B and because the distances 302A and 302B have the same polarity the values are subtracted from each other.

In some embodiments, the overlay measurement patterns 206 are part of a first layout pattern and the overlay measurement patterns 208 are part of a second layout pattern. Thus, by determining, e.g., measuring, the total overlay error between the overlay measurement patterns 206 and 208, the overlay error between the first layout pattern and the second layout pattern is determined.

As shown in FIG. 5D, the center-to-center distance between the reference patterns 502A and 502B is the distance 556 and the center-to-center distance between the overlay measurement patterns 206 and 208 is a distance 558. Because the shift distances 302A and 302B have opposite polarity, a difference between the distances 556 and 558 has a value, which is a sum of the absolute values of the shift distances 302A and 302B.

Figure 6A:
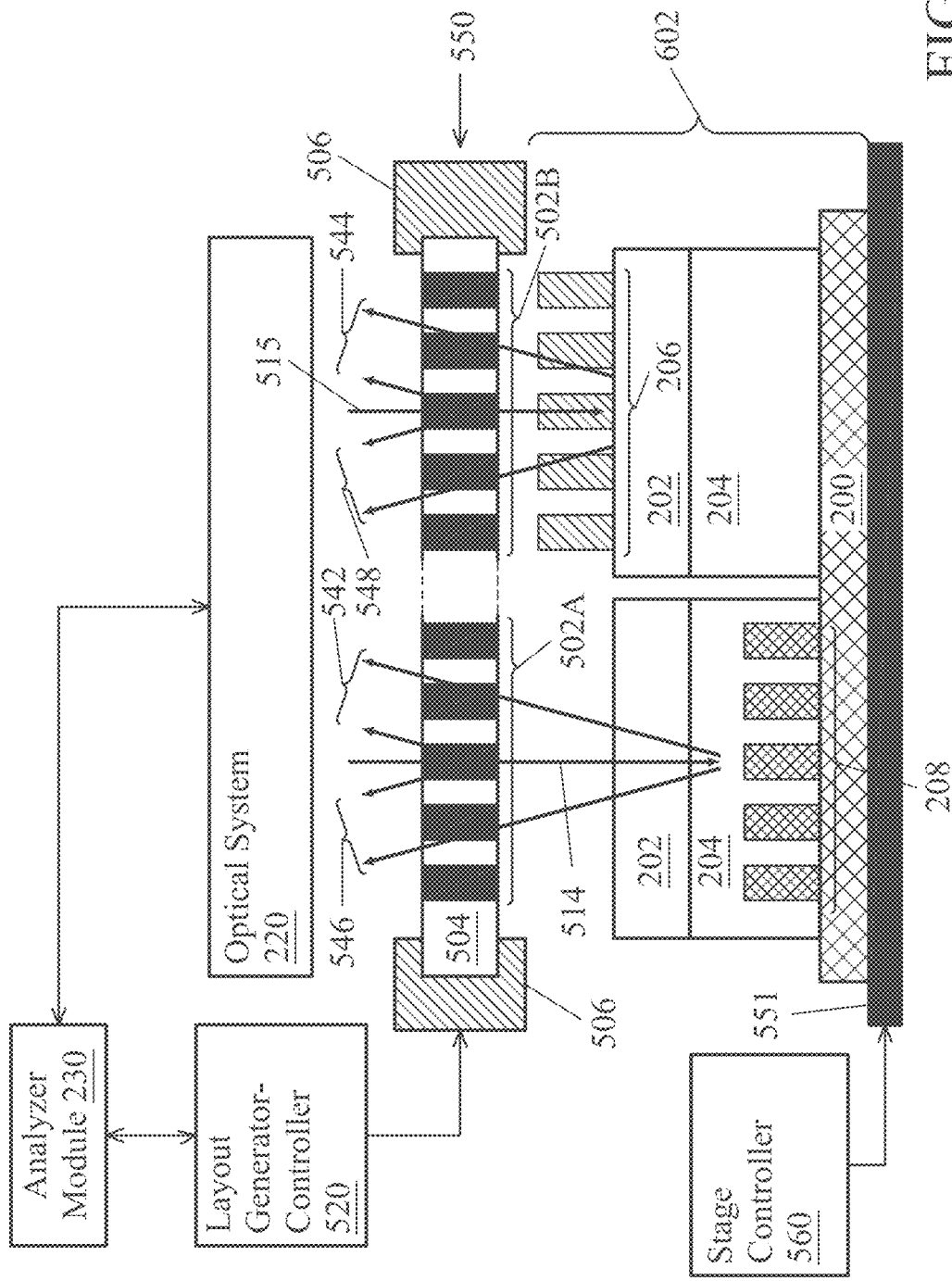
FIGS. 6A and 6B illustrate measurement systems for determining an overlay error in accordance with some embodiments of the disclosure.
Figure 6B:
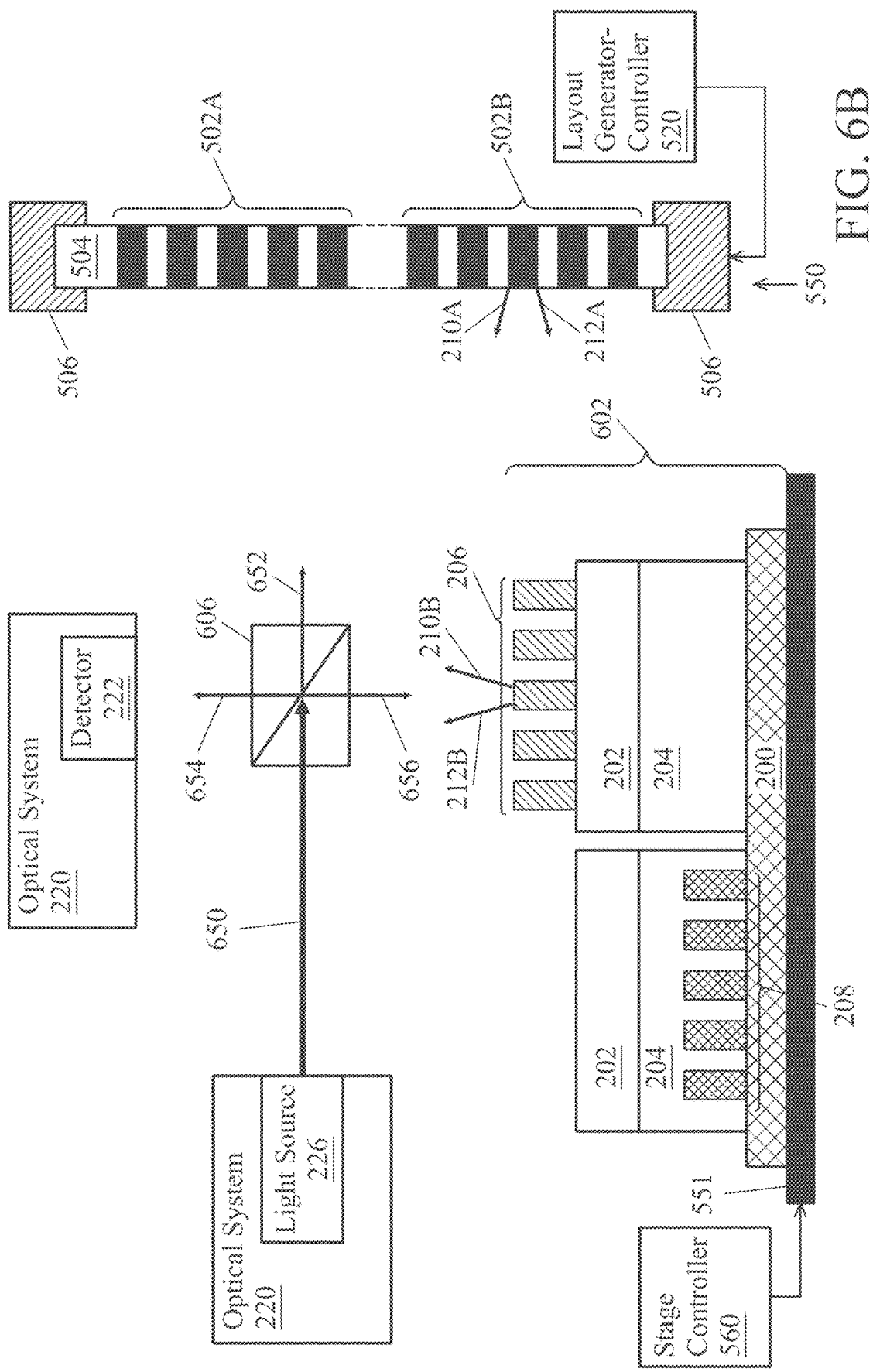

FIGS. 6A and 6B illustrate measurement systems for determining an overlay error in accordance with some embodiments of the disclosure. FIG. 6A shows a substrate 602, which is consistent with the substrate 232 of FIG. 5A. The substrate 602 is mounted on a stage 551, and the stage 551 is coupled to and controlled by a stage controller 560. The reference pattern module 550 is also mounted on top of and over the surface of the substrate 602 and in parallel with the stage 551. In some embodiments, the layout generator-controller 520 moves the reference patterns 502A and 502B to specific locations, e.g., by turning on/off the TFT transistors, and/or the stage controller 560 moves the substrate 602 such that the reference patterns 502A and 502B generated by the layout generator-controller 520 overlap, e.g., at least partially overlap, with the overlay measurement patterns 206 and 208 of the substrate 602. In some embodiments, the reference pattern 502A overlaps with the overlay measurement pattern 208 of the first layer 204 and the reference pattern 502B overlaps with the overlay measurement pattern 206 of the resist material layer 203. By measuring a relative position between the overlay measurement pattern 208 and the reference pattern 502A and a relative position between the overlay measurement pattern 206 and the reference pattern 502B, it is possible to measure an overlay error between the overlay measurement pattern 206 and the overlay measurement pattern 208 because the distance (e.g., center-to-center distance) between the reference pattern 502A and the reference pattern 502B is known or predetermined.

In some embodiments as shown in FIG. 6A, one of the light sources of the optical system 220 transmits an incident light beam 514 to the overlay measurement patterns 208 and the reference pattern 502A that at least have an overlap in the X-direction. In some embodiments, the overlay measurement pattern 208 and the reference pattern 502A have a same pitch. A portion of the incident light beam 514 is diffracted and reflected from the reference pattern 502A and produces the negative and positive first order diffractions that are inner portions of first order diffractions 542 and 546 respectively. A remaining portion of the incident light beam 514 passes through the reference pattern 502A and is diffracted and reflected from the overlay measurement pattern 208 and produces the negative and positive first order diffractions that are outer portions of first order diffractions 542 and 546 respectively. The negative and positive first order diffractions 542 and 546 that are reflected are detected by the detector 222 of the optical system 220.

FIG. 6A also shows the analyzer module 230 that is coupled to the optical system 220. The analyzer module 230 receives corresponding signals of the detected first order diffractions 542 and 546 and performs an analysis on the corresponding signals to determine a first drift, e.g., a first overlay error, between the overlay measurement pattern 208 and the reference pattern 502A. As described, in some embodiments, the wavelength of the light beam 514 is comparable with the pitch of the reference pattern 502A and the overlay measurement patterns 208. Also, in some embodiments, the wavelength of the light beam 515 is comparable with the pitch of the reference pattern 502B and the overlay measurement patterns 206. Thus, when the overlay measurement patterns 208 and 206 have different pitches, two different light sources of the optical system 220 having different wavelengths are used to produce the light beams 514 and 515. In some embodiments, when the overlay measurement patterns 208 and 206 have the same pitch, the same light source or two different light sources of the optical system 220 may be used to produce the light beams 514 and 515.

In addition, as shown in FIG. 6A, one of the light sources of the optical system 220 transmits an incident light beam 515 to the overlay measurement patterns 206 and the reference pattern 502B that at least have an overlap in the X-direction. In some embodiments, the overlay measurement pattern 206 and the reference pattern 502B have a same pitch that is not the same as the pitches of the overlay measurement pattern 208 and the reference pattern 502A. A portion of the incident light beam 515 is diffracted and reflected from the reference pattern 502B and produces the negative and positive first order diffractions that are inner portions of first order diffractions 544 and 548 respectively. A remaining portion of the incident light beam 515 passes through the reference pattern 502B and gets diffracted and reflected from the overlay measurement pattern 206 and produces the negative and positive first order diffractions that are outer portions of first order diffractions 544 and 548 respectively. The negative and positive first order diffractions 544 and 548 that are reflected are detected by the detector 222 of the optical system 220. The analyzer module 230 receives corresponding signals of the detected first order diffractions 544 and 548 and performs an analysis on the corresponding signals to determine a second drift, e.g., a second overlay error, between the overlay measurement pattern 206 and the reference pattern 502B. As described, a wavelength of the light beam irradiating the overlapped reference pattern 502B and the overlay measurement pattern 206 and a wavelength of the light beam irradiating the overlapped reference pattern 502A and the overlay measurement pattern 208 may be comparable to the pitches of the overlay measurement patterns 206 and 208.

In some embodiments, the layout generator-controller 520 has the information of the reference patterns 502A and 502B including a distance between the generated reference patterns 502A and 502B. In some embodiments, the overlap between the overlay measurement patterns 208 and the reference pattern 502A is concurrent with the overlap between the overlay measurement pattern 206 and the reference pattern 502B. In some embodiments, the distance between the generated reference patterns 502A and 502B is the expected distance between the overlay measurement patterns 206 and 208. Thus, the analyzer module 230 may determine the overlay error between the overlay measurement patterns 206 and 208 based on the first and second overlay errors.

In some embodiments, the overlap between the overlay measurement pattern 208 and the reference pattern 502A is not concurrent with the overlap between the overlay measurement pattern 206 and the reference pattern 502B. In addition, the analyzer module 230 receives the distance between the generated reference patterns 502A and 502B from the layout generator-controller 520 and also receives the stage 551 movement from the stage controller 560, and receives the location of the reference pattern module 550 from the layout generator-controller 520. Thus, the analyzer module 230 may determine the total overlay error between overlay measurement patterns 206 and 208 based on the first and second overlay errors, the distance between the reference patterns 502A and 502B, and the movement distances of the reference pattern module 550 and the stage 551. Thus, in some embodiments, the reference patterns 502A and 502B of the reference pattern module 550 are generated on the fly and the width and pitch of the reference patterns 502A and 502B are selected based on the width and pitch of the overlay measurement patterns 206 and 208. In some embodiments, the pitch of the reference patterns 502A and 502B are adjusted to increase the diffracted signals that are detected by the detectors. In some embodiments, the pitch of the reference patterns 502A and 502B are adjusted to match with the corresponding pitch of the overlay measurement patterns 206 and 208.

FIG. 6B shows the substrate 602, which is consistent with the substrate 232 of FIG. 5A. The substrate 602 is mounted on the stage 551 and the stage 551 is coupled to and controlled by the stage controller 560. The reference pattern module 550 is mounted on top of the substrate 602 and perpendicular to the stage 551. FIG. 6B also shows a beam splitter 606 that receives an incident light beam 650 and generates from the incident light beam 650 a first portion 652 parallel with incident light beam and second portion 656 perpendicular to the incident light beam. In some embodiments, the layout generator-controller 520 moves the reference patterns 502A and 502B to specific locations, e.g., by turning on/off the TFT transistors, and/or the stage controller 560 moves the substrate 602 such that the first portion 652 of the incident light beam 650 is incident on the reference pattern 502B and the second portion 656 of the incident light beam 650 is incident on the overlay measurement patterns 206.

In some embodiments, the first portion 652 of the incident light beam 650 is diffracted and reflected from the reference pattern 502B and produces the negative and positive first order diffractions 210A and 212A. The second portion 656 of the incident light beam 650 is diffracted and reflected from the overlay measurement pattern 206 and produces the negative and positive first order diffractions 210B and 212B. In some embodiments, an optical system, e.g., the beam splitter 606, receives the negative and positive first order diffractions 210A and 212A from the reference pattern 502B and also receives the negative and positive first order diffractions 210B and 212B from the overlay measurement pattern 206 and combines the received diffractions and transmits the combined diffractions 654 to the detector 222 of the optical system 220. In some embodiments, the diffraction angles of the negative and positive first order diffractions 210A and 212A from the reference pattern 502B are small, e.g., less than 30 degrees. Also the diffraction angles of the negative and positive first order diffractions 210B and 212B from the overlay measurement pattern 206 are small. Thus, the beam splitter 606 may combine the first order diffraction pattern from the reference pattern 502B and from the overlay measurement pattern 206. In some embodiments, optical systems, e.g., objective lenses (not shown), are placed in front of the reference pattern 502B and the overlay measurement pattern 206. The optical systems collect the first order diffractions and direct the first order diffractions to be combined. The negative and positive first order diffractions of the combined diffractions 654 are detected by the detector 222 of the optical system 220. The analyzer module 230 receives corresponding signals of the detected first order diffractions and performs an analysis on the corresponding signals to determine a second drift, e.g., the second overlay error, between the overlay measurement patterns 206 and the reference pattern 502B.

In some embodiments, the layout generator-controller 520 moves the reference patterns 502A and 502B to specific locations, e.g., by turning on/off the TFT transistors, and/or the stage controller 560 moves the substrate 602 such that the first portion 652 of the incident light beam 650 is incident on the reference patterns 502A and the second portion 656 of the incident light beam 650 is incident on the overlay measurement patterns 208. Similarly, the analyzer module 230 determines the first overlay error between the overlay measurement pattern 208 and the reference pattern 502A. Also, the analyzer module 230 may determine the total overlay error between overlay measurement patterns 206 and 208 based on the first and second overlay errors, the distance between the generated reference patterns 502A and 502B, and the movement distances of the reference pattern module 550 and the stage 551. In some embodiments, instead of or in addition to moving the substrate 602 and/or the reference pattern module 550, the beam splitter 606 is moved right-or-left and/or up-or-down.

Figure 7A:
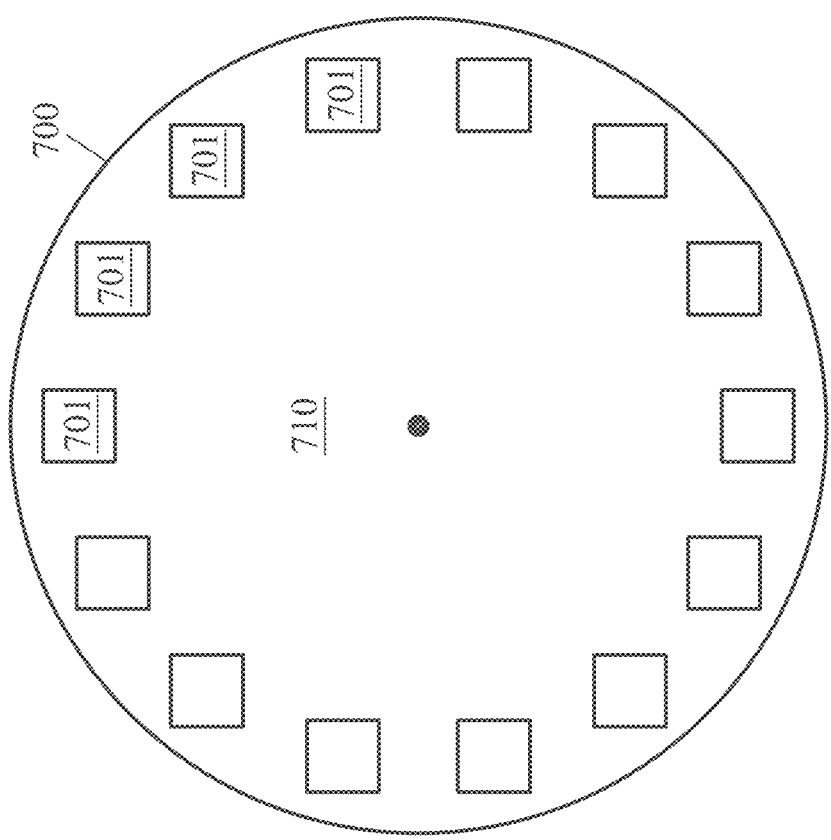
FIGS. 7A, 7B, and 7C illustrate reference pattern groups of reference patterns in accordance with an embodiment of the present disclosure.
Figure 7B:
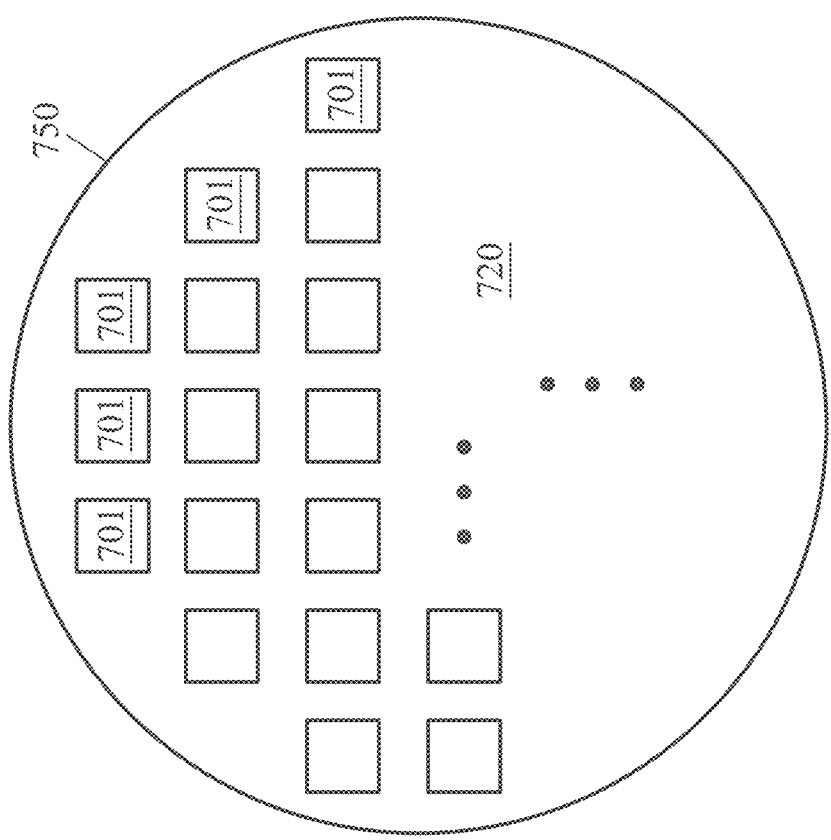
Figure 7C:
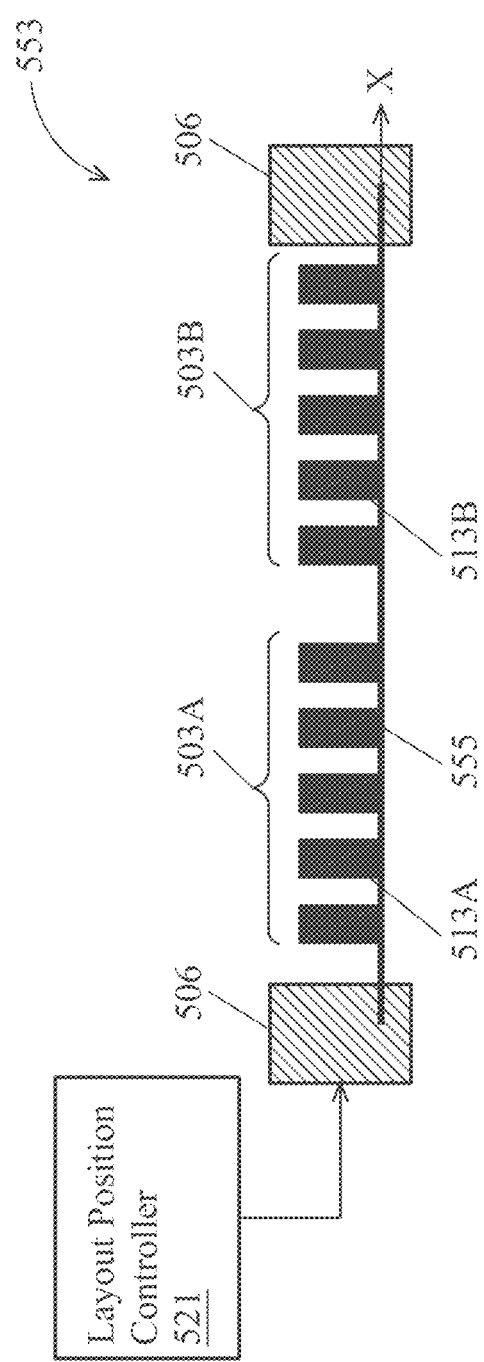

FIGS. 7A, 7B, and 7C illustrate reference pattern groups of reference patterns in accordance with an embodiment of the present disclosure. FIG. 7A illustrates a reference pattern group 700 that includes a number of reference patterns 701 that are consistent with the overly measurement patterns of FIG. 4 with multiple widths and pitches that are arrange along a perimeter of a substrate 710. In some embodiments, the reference patterns 701 of the reference pattern group 700 are disposed on the substrate 710 by, for example, oxide growth, patterning by lithography, and etching.

FIG. 7B illustrates a reference pattern group 750 that includes a number of reference patterns 701 with multiple widths and pitches that are arranges in a substrate 720. In some embodiments, the reference patterns 701 of the reference pattern group 750 are disposed on the substrate 720 by, for example, oxide growth, patterning by lithography, and etching.

FIG. 7C is a cross-sectional view of a reference pattern module 553 that is consistent with the reference pattern module 550 of FIG. 5B. The reference pattern module 553 is created by disposing the sub-patterns (boxes) 513A and 513B on a substrate 555. The reference pattern module 553 is not a liquid crystal panel and the sub-patterns (boxes) 513A and 513B of the reference pattern module 553 are created through oxide growth, patterning the oxide, and etching the oxide. However, the sub-patterns (boxes) 513A and 513B are consistent with the sub-patterns (boxes) 510A and 510B and the reference patterns 503A and 503B are respectively consistent with the reference patterns 502A and 502B. In some embodiments, the measurement systems of FIGS. 6A and 6B may use the reference pattern module 553 instead of the reference pattern module 550. Referring back to FIG. 6B, the layout position controller 521 of FIG. 7C and/or the stage controller 560 moves the substrate 602 and/or the reference pattern module 553 such that the first portion 652 of the incident light beam 650 is incident on a selected reference pattern 503A of the reference pattern module 553 and the second portion 656 of the incident light beam 650 is incident on the overlay measurement patterns 208. In addition, the layout position controller 521 and/or the stage controller 560 moves the substrate 602 and/or the reference pattern module 553 such that the first portion 652 of the incident light beam 650 is incident on the reference pattern 503B of the reference pattern module 553 and the second portion 656 of the incident light beam 650 is incident on the overlay measurement patterns 206. In some embodiments, the reference patterns 503A and 503B are not adjacent to each other.

Figure 8:
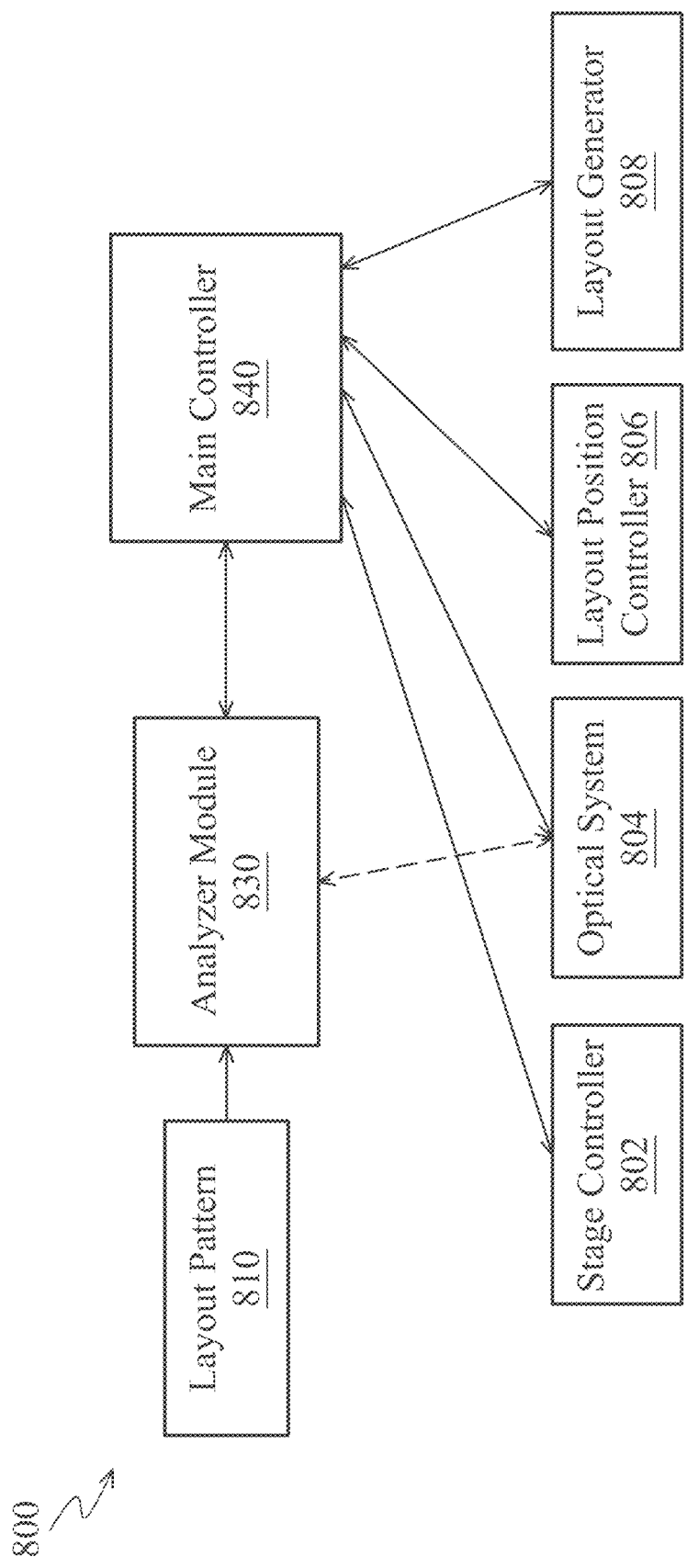
FIG. 8 illustrates an exemplary measurement system for determining an overlay error in accordance with some embodiments of the disclosure.

FIG. 8 illustrates a measurement system for determining an overlay error in accordance with some embodiments of the disclosure. The system 800 includes an analyzer module 830 and a main controller 840 coupled to each other. The analyzer module 830, which is consistent with the analyzer module 230 of FIGS. 2B, 6A, and 6B receives one or more layout patterns 810 to be generated on the reference pattern module 550 of the FIGS. 5B and 5C. The analyzer module 830 may either directly connect to the optical system 804 or may connect to the optical system 804 via the main controller 840.

In some embodiments, the main controller 840 is coupled to a layout generator 808, a layout position controller 806, an optical system 804, and a stage controller 802. In some embodiments and returning back to FIGS. 2B, 6A, and 6B the optical system 804 is consistent with the optical system 220. The optical system 804, which is controlled by the main controller 840, generates the incident light beams 214A, 514, 515, and 650 of FIGS. 2B, 6A, and 6B. In addition, the optical system 804 receives the diffracted light from the overlay measurement patterns and detects the diffracted light and generates corresponding signals of the detected diffracted light. The optical system 804 sends the corresponding signals of the detected diffracted light to the analyzer module for analysis as described above with respect to FIGS. 6A and 6B to determine a drift between different overlay measurement patterns of the substrate. In some embodiments, the layout generator-controller 520 of FIGS. 5B, 6A, and 6B is consistent with the combination of the layout position controller 806 and layout generator 808. In some embodiments, the layout position controller 521 of FIG. 7C is consistent with the layout position controller 806. In some embodiments, the layout position controller 806 is combined into the layout generator 808 and by turning on/off the TFT transistors, the layout generator 808 moves the reference patterns by the pixel resolution of the LCD panel.

In some embodiments, the analyzer module 830 sends the one or more layout patterns 810 directly or via the main controller 840 to the layout generator 808 and commands the layout generator 808 to create the one or more layout patterns 810 in the reference pattern module 550 of the FIGS. 5B, 5C, 6A, and 6B.

Figure 9:
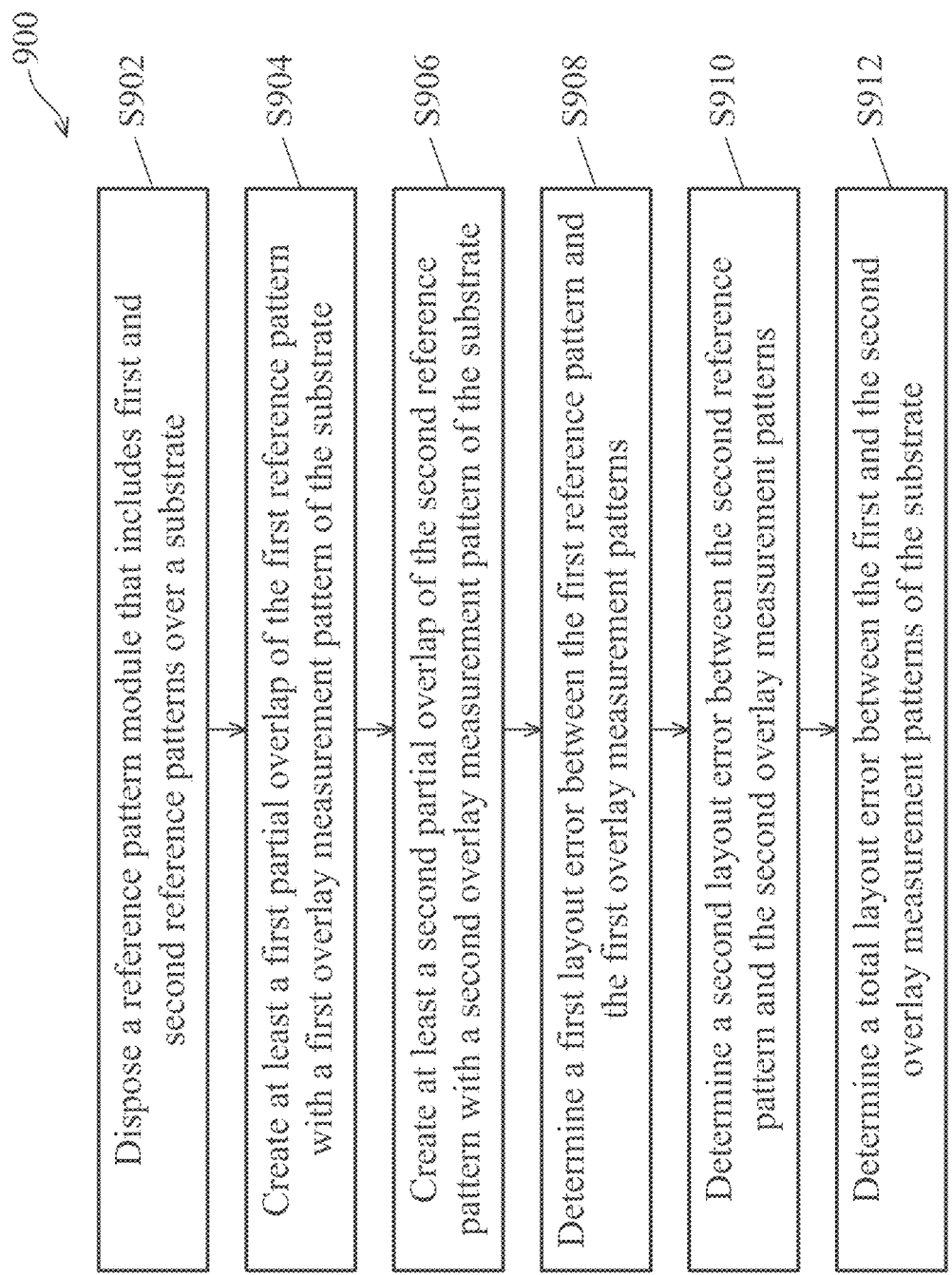
FIG. 9 illustrates a flow diagram of an exemplary process for determining an overlay error in accordance with some embodiments of the disclosure.

FIG. 9 illustrates a flow diagram of an exemplary process 900 for determining an overlay error in accordance with some embodiments of the disclosure. The process 900 may be performed by the measurement systems of FIGS. 6A, 6B, and 8. In some embodiments, a portion of the process 900 is performed and/or is controlled by the computer system 1000 described below with respect to FIGS. 10A and 10B. The method includes the operation S902 of disposing a reference pattern module that includes first and second reference patterns over a substrate. As shown in FIG. 5B, the reference pattern module 550 includes the first and second reference patterns 502A and 502B. Also, as shown in FIGS. 6A and 6B the reference pattern module 550 is placed above, e.g., over, a substrate 602. In some embodiments, the substrate 602 includes first and second overlay measurement patterns 206 and 208.

In operation S904, at least a first partial overlap is created between the first reference pattern and the first overlay measurement pattern of the substrate. As shown in FIG. 6A, an overlap is created between the first reference pattern 502A of the reference pattern module 550 and the first overlay measurement pattern 208 of the substrate 602.

In operation S906, at least a second partial overlap is created between the second reference pattern and the second overlay measurement pattern of the substrate. As shown in FIG. 6A, an overlap is created between the second reference pattern 502B of the reference pattern module 550 and the second overlay measurement pattern 206 of the substrate 602. In some embodiments, operations S904 and S906 are performed simultaneously.

In operation S908, a first layout error between the first reference pattern and first overlay measurement patterns is determined. As shown in FIG. 6A, the optical system 220 transmits the incident light beam 514 to the first reference pattern 502A that is on top of the first overlay measurement pattern 208. The reflected first order diffractions 542 and 546 from the first reference pattern 502A and from the first overlay measurement pattern 208 are detected by the optical system 220 and the detected signals are transmitted to the analyzer module 230. The analyzer module 230 determines, e.g., calculates, the first layout error between the first overlay measurement pattern 208 and the first reference pattern 502A based on the detected signals.

In operation S910, a second layout error between the second reference pattern and second overlay measurement patterns is determined. As shown in FIG. 6A, the optical system 220 transmits the incident light beam 515 to the second reference pattern 502B that is on top of the second overlay measurement pattern 206. The reflected first order diffractions 544 and 548 from the second reference pattern 502B and from the second overlay measurement pattern 206 are detected by the optical system 220 and the detected signals are transmitted to the analyzer module 230. The analyzer module 230 calculates the second layout error between the second measurement patterns 206 and the second reference pattern 502B based on the detected signals.

In operation S912, a total layout error between the first and the second overlay measurement patterns of the substrate is determined. The total layout error between the first overlay measurement pattern 208 and the second overlay measurement pattern 206 is determined by the analyzer module 230. In some embodiments, as described above, the total layout error is an algebraic sum, e.g., addition or subtraction, of the first and the second layout errors.

Figures 10A, 10B:
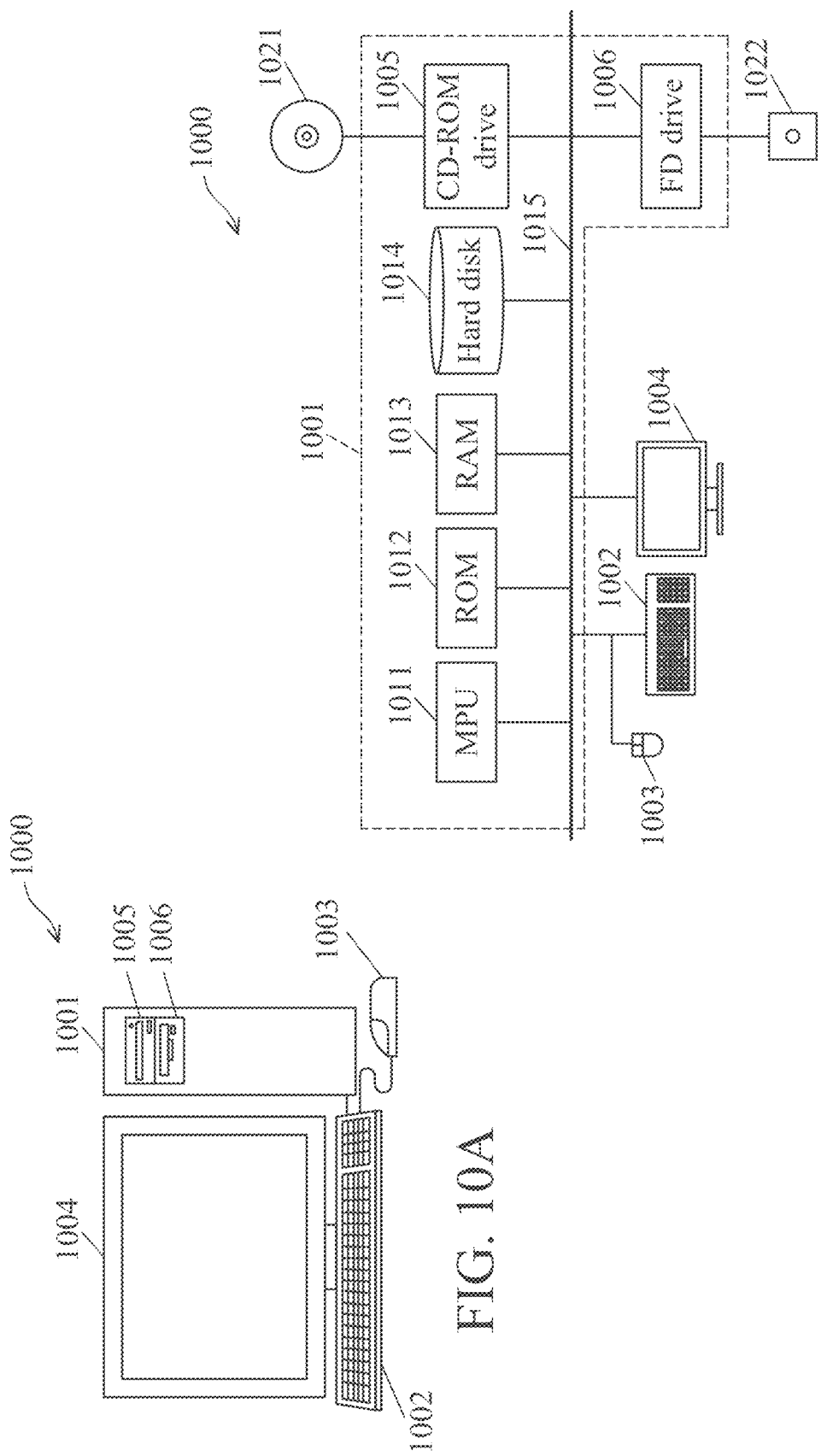
FIGS. 10A and 10B illustrate an apparatus for determining an overlay error in accordance with some embodiments of the disclosure.

FIGS. 10A and 10B illustrate an apparatus for determining an overlay error in accordance with some embodiments of the disclosure. FIG. 10A is a schematic view of a computer system 1000 that executes the process for determining the overlay error according to one or more embodiments as described above. All of or a part of the processes, method and/or operations of the foregoing embodiments can be realized using computer hardware and computer programs executed thereon. The operations include controlling an optical system and the light sources and detectors of the optical system, analyzing the light detected by the detectors, generating and/or controlling the generation of reference patterns in a reference pattern module, and controlling the movement of a stage holding a substrate and the movement of the reference pattern module to combine the diffracted light from the overlay measurement patterns of the substrate on the stage and the reference patterns of the reference pattern module. Thus, in some embodiments, the computer system 1000 provides the functionality of the analyzer module 830, the main controller 840, the stage controller 802, the layout position controller 806, and a controller of the optical system 804. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors 1011, such as a micro-processor unit (MPU), a ROM 1012 in which a program such as a boot up program is stored, a random access memory (RAM) 1013 that is connected to the processors 1011 and in which a command of an application program is temporarily stored and a temporary storage area is provided, a hard disk 1014 in which an application program, a system program, and data are stored, and a bus 1015 that connects the processors 1011, the ROM 1012, and the like. Note that the computer 1001 may include a network card (not shown) for providing a connection to a LAN.

The program for causing the computer system 1000 to execute the process for determining an overlay error of a semiconductor device in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the process for manufacturing the lithographic mask of a semiconductor device in the foregoing embodiments. The program may only include a command portion to call an appropriate function (module) in a controlled mode and obtain desired results.

As discussed above, a stand-alone reference pattern module separate from the substrate can be used for determining an overlay error between different layout patterns of the substrate or between an existing layout pattern of the substrate and a layout pattern of a resist material layer on the substrate that is being patterned by a lithographic process. By using the stand-alone reference pattern module, the overlay error of each layer is measured with respect to the stand-alone reference pattern module. The overlay error of each two layers can be determined by an algebraic sum of the overlay errors between the two layers and the stand-alone reference pattern module. Therefore, the different patterned layers of the substrate do not need to have multiple overlay measurement patterns in each layer to make sure there is an overlap between the overlay measurement patterns of each two layers. Also, the overlay measurement pattern does not need to be re-designed when the film stack changes.

It will be understood that not all advantages have been necessarily discussed herein, no particular advantage is required for all embodiments or examples, and other embodiments or examples may offer different advantages.

According to some embodiments of the present disclosure, a method of overlay error measurement includes disposing a reference pattern module over a substrate. The substrate includes a first overlay measurement pattern in a first location and a second overlay measurement pattern separate from the first overlay measurement pattern in a second location. The reference pattern module includes a first reference pattern and a second reference pattern separate from the first reference pattern. The method includes creating at least a first partial overlap of the first reference pattern with the first overlay measurement pattern under the reference pattern module and concurrently with the first partial overlap, creating at least a second partial overlap of the second reference pattern with the second overlay measurement pattern under the reference pattern module. The method further includes determining a first overlay error between the first reference pattern of the reference pattern module and the first overlay measurement pattern of the substrate, determining a second overlay error between the second reference pattern of the reference pattern module and the second overlay measurement pattern of the substrate, and determining a total overlay error between the first and second overlay measurement patterns of the substrate based on the first and second overlay errors. In an embodiment, the first overlay measurement pattern is included in a first layout pattern that is in a first layer of the substrate and the second overlay measurement pattern is included in a second layout pattern that is in a second layer of the substrate different from the first layer and an overlay error between the first and the second layout patterns is determined based on the total overlay error. In an embodiment, determining the overlay error between the first and the second layout patterns includes determining an algebraic sum of the first and second overlay errors. In an embodiment, determining the first overlay error includes applying a first beam of light over the first partial overlap of the first reference pattern and the first overlay measurement pattern and analyzing diffracted light from the first overlay measurement pattern and the first reference pattern to determine the first overlay error. In an embodiment, determining the second overlay error includes applying a second beam of light over the second partial overlap of the second reference pattern and the second overlay measurement pattern and analyzing diffracted light from the second overlay measurement pattern and the second reference pattern to determine the second overlay error. In an embodiment, analyzing the diffracted light includes determining an intensity difference between positive and negative first order diffracted light. In an embodiment, the method further includes that prior to the first partial overlap, generating the first reference pattern and the second reference pattern of the reference pattern module. The first reference pattern has a first pitch equal to a pitch of the first overlay measurement pattern of the substrate and the second reference pattern has a second pitch equal to a pitch of the second overlay measurement pattern of the substrate. In an embodiment, the first reference pattern of the reference pattern module includes a first plurality of third sub-patterns extending in a first direction and being arranged in a second direction crossing the first direction, and a second plurality of third sub-patterns extending in the first direction and being arranged in the second direction. The first plurality of third sub-patterns and the second plurality of third sub-patterns are arranged with an equal distance D3 at opposite sides of a third central line extending in the first direction. Also, the first overlay measurement pattern of the substrate includes a third plurality of first sub-patterns extending in the first direction and being arranged in the second direction crossing the first direction, and a fourth plurality of first sub-patterns extending in the first direction and being arranged in the second direction. The third plurality of first sub-patterns and the fourth plurality of first sub-patterns are arranged with an equal distance D1 at opposite sides of a first central line extending in the first direction and when the first reference pattern of the reference pattern module is disposed over the first overlay measurement pattern of the substrate and the first central line and the third central line overlap, the first plurality of third sub-patterns of the first reference pattern of the reference pattern module has an offset d=D1-D3 with the third plurality of first sub-patterns of the first overlay measurement pattern of the substrate and the second plurality of third sub-patterns of the first reference pattern of the reference pattern module has an offset -d=D3-D1 with the fourth plurality of first sub-patterns of the first overlay measurement pattern of the substrate. In an embodiment, determining the first overlay error includes applying a first beam of light over the first partial overlap of the first overlay measurement pattern and the first reference pattern. Determining the first overlay error also includes analyzing a first diffracted light from the first plurality of third sub-patterns of the first reference pattern and the third plurality of first sub-patterns of the first overlay measurement pattern to determine a first asymmetry function AS1 based on positive and negative first order diffraction of the first diffracted light. Determining the first overlay error further includes analyzing a second diffracted light from the second plurality of third sub-patterns of the first reference pattern and the fourth plurality of first sub-patterns of the first overlay measurement pattern to determine a second asymmetry function AS2 based on positive and negative first order diffraction of the second diffracted light. Determining the first overlay error further includes determining the first overlay error between the first reference pattern of the reference pattern module and the first overlay measurement pattern of the substrate as:

$$d\left(\frac{AS1 + AS2}{AS1 - AS2}\right).$$

According to some embodiments of the present disclosure, a method of overlay error measurement includes performing a first analysis of a first combination of diffracted light received from a first reference pattern of a reference pattern module and received from a first overlay measurement pattern in a first location of a first layer of a substrate to determine a first overlay error between the first reference pattern of the reference pattern module and the first overlay measurement pattern of the substrate. The method also includes performing a second analysis of a second combination of diffracted light received from a second reference pattern of a reference pattern module and received from a second overlay measurement pattern in a second location of a second layer of the substrate to determine a second overlay error between the second reference pattern of the reference pattern module and the second overlay measurement pattern of the substrate. The method further includes determining a total overlay error between the first and second overlay measurement pattern of the substrate based on the first and second overlay errors. In an embodiment, the reference pattern module is disposed in parallel over the substrate. In an embodiment, the first overlay measurement pattern and the second overlay measurement pattern are in different layers of the substrate. In an embodiment, the reference pattern module is disposed perpendicular to the substrate and the method further includes projecting a coherent beam of light to a beam splitter and configuring the beam splitter to direct a first portion of the coherent beam of light from the beam splitter to the first reference pattern of the reference pattern module and directing a remaining second portion of the coherent beam of light from the beam splitter to the first location of the first layer of the substrate. The method further includes combining by the beam splitter, diffracted light received from the first reference pattern of the reference pattern module and received from the first overlay measurement pattern in the first location of the substrate to generate the first combination of diffracted light. The method also includes directing, by the beam splitter, the first combination of diffracted light received from the first overlay measurement pattern and received from the first reference pattern to an optical system for detection and analysis. And the method includes analyzing positive and negative first order diffraction of the first combination of diffracted light by an analyzer module coupled to or included in the optical system to determine the first overlay error. In an embodiment, the method further includes configuring the beam splitter to direct the first portion of the coherent beam of light from the beam splitter to the second reference pattern of the reference pattern module and directing the remaining second portion of the coherent beam of light from the beam splitter to the second location of the second layer of the substrate. The method includes combining by the beam splitter, diffracted light received from the second reference pattern of the reference pattern module and received from the second overlay measurement pattern in the second location of the substrate to generate the second combination of diffracted light. The method includes directing, by the beam splitter, the second combination of diffracted light received from the second overlay measurement pattern and received from the second reference pattern to the optical system for detection and analysis. And the method includes analyzing positive and negative first order diffraction of the second combination of diffracted light by the analyzer module to determine the second overlay error.

According to some embodiments of the present disclosure, a system for determining an overlay error includes a main controller and a reference pattern module disposed above a substrate, the substrate comprising a first overlay measurement pattern in a first location of the substrate and a second overlay measurement pattern in a second location of the substrate. The system includes an analyzer module coupled to the main controller. The analyzer module receives a first reference pattern and a second reference pattern. The system includes a layout generator coupled to the main controller and receives the first and second reference patterns and an offset between the first and second reference patterns from the analyzer module via the main controller. The layout generator is further coupled to the reference pattern module and generates the first and the second reference patterns in the reference pattern module. The system includes a stage controller coupled to the main controller to control the movement of the substrate and an optical system that includes one or more light sources and coupled to the main controller. The one or more light sources generate a first beam of light to radiate the first reference pattern of the reference pattern module and to radiate the first overlay measurement pattern of the substrate. The one or more light sources generate a second beam of light to radiate the second reference pattern of the reference pattern module and to radiate the second overlay measurement pattern of the substrate. The optical system also includes one or more light detectors. The one or more light detectors receive a first combination of diffracted light from the first overlay measurement pattern and the first reference pattern and receive a second combination of diffracted light from the second overlay measurement pattern and the second reference pattern. The analyzer module also receives detected signals associated with the first combination of diffracted light to determine a first overlay error between the first reference pattern of the reference pattern module and the first overlay measurement pattern of the substrate and receives detected signals associated with the second combination of diffracted light to determine a second overlay error between the second reference pattern of the reference pattern module and the second overlay measurement pattern of the substrate. In an embodiment, the first overlay measurement pattern is included in a first layout pattern in a first layer of the substrate and the second overlay measurement pattern is included in a second layout pattern in a second layer of the substrate different from the first layer. An overlay error between the first layout pattern and the second layout pattern of the substrate is determined based on the first overlay error and the second overlay error. In an embodiment, the reference pattern module is disposed in parallel over the substrate. The system further includes a layout position controller coupled to the reference pattern module to move the reference pattern module in parallel with the substrate. The stage controller and the layout position controller produce at least a first partial overlap of the first reference pattern above the substrate with the first overlay measurement pattern in the first location of the substrate. And also produce at least a second partial overlap of the second reference pattern above the substrate with the second overlay measurement pattern in the second location of the substrate. The one or more light sources produce the first beam of light over the first partial overlap and produce the second beam of light over the second partial overlap. In an embodiment, the reference pattern module is disposed over the substrate and perpendicular to a surface of the substrate. The system further includes a layout position controller coupled to the reference pattern module to move the layout position controller perpendicular to the substrate. The system includes a beam splitter to receive the first beam of light and to split the first beam of light such that a first portion of the first beam of light radiates the first overlay measurement pattern at the first location of the substrate and a remaining second portion of the first beam of light radiates the first reference pattern of the reference pattern module. The beam splitter also receives the second beam of light and to split the second beam of light such that a first portion of the second beam of light radiates the second overlay measurement pattern at the second location of the substrate and a remaining second portion of the second beam of light radiates the second reference pattern of the reference pattern module. The stage controller and the layout position controller move the substrate and the reference pattern module such that the first and second portions of the first beam of light simultaneously radiate the first overlay measurement pattern and the first reference pattern and the first and second portions of the second beam of light simultaneously radiate the second overlay measurement pattern and the second reference pattern. In an embodiment, the diffracted light from the first reference pattern and the first overlay measurement pattern are respectively reflected back from the reference pattern module and the substrate. The beam splitter combines the diffracted light from the first overlay measurement pattern and the first reference pattern and produces the first combination of diffracted light and sends the first combination of diffracted light to the one or more light detectors of the optical system. The diffracted light from the second reference pattern and the second overlay measurement pattern are respectively reflected back from the reference pattern module and the substrate. The beam splitter also combines the diffracted light from the second overlay measurement pattern and the second reference pattern and produces the second combination of diffracted light and sends the second combination of diffracted light to the one or more light detectors of the optical system. In an embodiment, the one or more light sources of the optical system are coherent light sources.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for determining an overlay error, comprising:
   a main controller;
   a reference pattern module disposed above a substrate, the substrate comprising a first overlay measurement pattern in a first location of the substrate and a second overlay measurement pattern in a second location of the substrate;
   an analyzer module coupled to the main controller, wherein the analyzer module is configured to receive a first reference pattern and a second reference pattern;
   a layout generator coupled to the main controller and configured to receive the first and second reference patterns and an offset between the first and second reference patterns from the analyzer module via the main controller, the layout generator further coupled to the reference pattern module and configured to generate the first and the second reference patterns in the reference pattern module;
   a stage controller coupled to the main controller and configured for movement control of the substrate; and
   an optical system comprising one or more light sources and coupled to the main controller, the one or more light sources configured to generate a first beam of light to radiate the first reference pattern of the reference pattern module and to radiate the first overlay measurement pattern of the substrate and to generate a second beam of light to radiate the second reference pattern of the reference pattern module and to radiate the second overlay measurement pattern of the substrate;
   the optical system further comprising one or more light detectors, the one or more light detectors configured to receive a first combination of diffracted light from the first overlay measurement pattern and the first reference pattern and to receive a second combination of diffracted light from the second overlay measurement pattern and the second reference pattern; and the analyzer module further configured to receive detected signals associated with the first combination of diffracted light to determine a first overlay error between the first reference pattern of the reference pattern module and the first overlay measurement pattern of the substrate and to receive detected signals associated with the second combination of diffracted light to determine a second overlay error between the second reference pattern of the reference pattern module and the second overlay measurement pattern of the substrate.

2. The system of claim 1, wherein the first overlay measurement pattern is included in a first layout pattern in a first layer of the substrate and the second overlay measurement pattern is included in a second layout pattern in a second layer of the substrate different from the first layer, and wherein an overlay error between the first layout pattern and the second layout pattern of the substrate is determined based on the first overlay error and the second overlay error.

3. The system of claim 2, wherein a total overlay error between the first and the second layout patterns is an algebraic sum of the first and second overlay errors.

4. The system of claim 1, wherein the reference pattern module is disposed in parallel over the substrate, wherein the system further comprising a layout position controller coupled to the reference pattern module and configured to move the reference pattern module in parallel with the substrate, wherein the stage controller and the layout position controller are configured to produce at least a first partial overlap of the first reference pattern above the substrate with the first overlay measurement pattern in the first location of the substrate and to produce at least a second partial overlap of the second reference pattern above the substrate with the second overlay measurement pattern in the second location of the substrate and wherein the one or more light sources are configured to produce the first beam of light over the first partial overlap and to produce the second beam of light over the second partial overlap.

5. The system of claim 1, wherein the reference pattern module is disposed over the substrate and perpendicular to a surface of the substrate, wherein the system further comprising:

a layout position controller coupled to the reference pattern module and configured to move the layout position controller perpendicular to the substrate; and a beam splitter configured to receive the first beam of light and to split the first beam of light such that a first portion of the first beam of light radiates the first overlay measurement pattern at the first location of the substrate and a remaining second portion of the first beam of light radiates the first reference pattern of the reference pattern module, wherein the beam splitter further configured to receive the second beam of light and to split the second beam of light such that a first portion of the second beam of light radiates the second overlay measurement pattern at the second location of the substrate and a remaining second portion of the second beam of light radiates the second reference pattern of the reference pattern module, and wherein the stage controller and the layout position controller are configured to move the substrate and the reference pattern module such that the first and second portions of the first beam of light simultaneously radiate the first overlay measurement pattern and the first reference pattern and the first and second portions of the second beam of light simultaneously radiate the second overlay measurement pattern and the second reference pattern.

6. The system of claim 5, wherein the diffracted light from the first reference pattern and the first overlay measurement pattern are respectively reflected back from the reference pattern module and the substrate, wherein the beam splitter is configured to combine the diffracted light from the first overlay measurement pattern and the first reference pattern to produce the first combination of diffracted light and to send the first combination of diffracted light to the one or more light detectors of the optical system; and wherein the diffracted light from the second reference pattern and the second overlay measurement pattern are respectively reflected back from the reference pattern module and the substrate, wherein the beam splitter is configured to combine the diffracted light from the second overlay measurement pattern and the second reference pattern and to produce the second combination of diffracted light and to send the second combination of diffracted light to the one or more light detectors of the optical system.

7. The system of claim 1, wherein the one or more light sources of the optical system are coherent light sources.

8. A system for determining an overlay error, comprising:

a processor executing an analyzer module;

a reference pattern module disposed above a substrate, wherein the substrate comprises a first overlay measurement pattern in a first location of a first layer of the substrate and a second overlay measurement pattern in a second location of a second layer of the substrate, and wherein the reference pattern module comprises a first reference pattern and a separate second reference pattern;

an optical system comprising one or more light sources and configured to generate a first beam of light to radiate the first reference pattern of the reference pattern module and to radiate the first overlay measurement pattern of the substrate and to generate a second beam of light to radiate the second reference pattern of the reference pattern module and to radiate the second overlay measurement pattern of the substrate;

the optical system further comprising one or more light detectors, the one or more light detectors configured to receive a first combination of diffracted light from the first overlay measurement pattern and the first reference pattern and to receive a second combination of diffracted light from the second overlay measurement pattern and the second reference pattern; and the analyzer module is configured to receive detected signals associated with the first combination of diffracted light to determine a first overlay error between the first reference pattern of the reference pattern module and the first overlay measurement pattern of the substrate and to receive detected signals associated with the second combination of diffracted light to determine a second overlay error between the second reference pattern of the reference pattern module and the second overlay measurement pattern of the substrate.

9. The system of claim 8, wherein the first overlay measurement pattern is included in a first layout pattern that is in the first layer of the substrate and the second overlay measurement pattern is included in a second layout pattern that is in the second layer of the substrate different from the first layer, and wherein a total overlay error between the first and the second layout patterns is an algebraic sum of the first overlay error and the second overlay error.

10. The system of claim 8, wherein the first reference pattern overlaps partially with the first overlay measurement pattern and the second reference pattern overlaps partially with the second overlay measurement pattern; wherein the determining the first overlay error comprises:
applying a first beam of light over the first partial overlap of the first reference pattern and the first overlay measurement pattern; and
analyzing diffracted light from the first overlay measurement pattern and the first reference pattern to determine the first overlay error.

11. The system of claim 10, wherein the determining the second overlay error comprises:
applying a second beam of light over the second partial overlap of the second reference pattern and the second overlay measurement pattern; and
analyzing diffracted light from the second overlay measurement pattern and the second reference pattern to determine the second overlay error.

12. The system of claim 11, wherein the analyzing the diffracted light comprises determining an intensity difference between positive and negative first order diffracted light.

13. The system of claim 8, further comprising:
prior to creating the first partial overlap, generating the first reference pattern and the second reference pattern of the reference pattern module, wherein the first reference pattern has a first pitch equal to a pitch of the first overlay measurement pattern of the substrate, and wherein the second reference pattern has a second pitch equal to a pitch of the second overlay measurement pattern of the substrate.

14. The system of claim 13, wherein:
the first reference pattern of the reference pattern module comprises a first plurality of third sub-patterns extending in a first direction and being arranged in a second direction crossing the first direction, and a second plurality of third sub-patterns extending in the first direction and being arranged in the second direction, wherein the first plurality of third sub-patterns and the second plurality of third sub-patterns are arranged with an equal distance D3 at opposite sides of a third central line extending in the first direction; and
the first overlay measurement pattern of the substrate comprises a third plurality of first sub-patterns extending in the first direction and being arranged in the second direction crossing the first direction, and a fourth plurality of first sub-patterns extending in the first direction and being arranged in the second direction, wherein the third plurality of first sub-patterns and the fourth plurality of first sub-patterns are arranged with an equal distance D1 at opposite sides of a first central line extending in the first direction, wherein when the first reference pattern of the reference pattern module is disposed over the first overlay measurement pattern of the substrate and the first central line and the third central line overlap, the first plurality of third sub-patterns of the first reference pattern of the reference pattern module has an offset d=D1−D3 with the third plurality of first sub-patterns of the first overlay measurement pattern of the substrate and the second plurality of third sub-patterns of the first reference pattern of the reference pattern module has an offset −d=D3−D1 with the fourth plurality of first sub-patterns of the first overlay measurement pattern of the substrate.

15. The system of claim 14, wherein the determining the first overlay error comprises:
applying a first beam of light over the first partial overlap of the first overlay measurement pattern and the first reference pattern;
analyzing a first diffracted light from the first plurality of third sub-patterns of the first reference pattern and the third plurality of first sub-patterns of the first overlay measurement pattern to determine a first asymmetry function AS1 based on positive and negative first order diffraction of the first diffracted light;
analyzing a second diffracted light from the second plurality of third sub-patterns of the first reference pattern and the fourth plurality of first sub-patterns of the first overlay measurement pattern to determine a second asymmetry function AS2 based on positive and negative first order diffraction of the second diffracted light; and
determining the first overlay error between the first reference pattern of the reference pattern module and the first overlay measurement pattern of the substrate as: d ((AS1+AS2)/(AS1−AS2)).

16. A system for determining an overlay error, comprising:
a controller coupled to an analyzer module;
a reference pattern module disposed above a substrate, wherein the substrate comprises a first overlay measurement pattern in a first location of a first layer of the substrate and a second overlay measurement pattern in a second location of a second layer of the substrate, wherein the reference pattern module comprises a first reference pattern and a separate second reference pattern, and wherein the first reference pattern partially overlaps optically with the first overlay measurement pattern and the second reference pattern partially overlaps optically with the second overlay measurement pattern; and
the analyzer module is configured to:
determine a first overlay error between the first reference pattern of the reference pattern module and the first overlay measurement pattern of the substrate,
determine a second overlay error between the second reference pattern of the reference pattern module and the second overlay measurement pattern of the substrate, and
determine a total overlay error between the first and second overlay measurement patterns of the substrate based on the first and second overlay errors.

17. The system of claim 16, wherein the reference pattern module is disposed in parallel over the substrate.

18. The system of claim 16, wherein the first overlay measurement pattern and the second overlay measurement pattern are in different layers of the substrate.

19. The system of claim 16, wherein the reference pattern module is disposed perpendicular to the substrate and the system further comprises an optical system coupled to the analyzer module and a beam splitter, the beam splitter is configured to:
direct a first portion of a received coherent beam of light to the first reference pattern of the reference pattern module and to direct a remaining second portion of the coherent beam of light to the first location of the first layer of the substrate;

combine diffracted light received from the first reference pattern of the reference pattern module and received from the first overlay measurement pattern in the first location of the substrate to generate a first combination of diffracted light;

direct the first combination of diffracted light received from the first overlay measurement pattern and received from the first reference pattern to the optical system for detection; and direct a detected signal of the optical system to the analyzer module, wherein the analyzer module is configured to:

analyze positive and negative first order diffractions of the first combination of diffracted light to determine the first overlay error.

20. The system of claim 19, wherein the optical system further comprises one or more coherent light sources.

* * * * *